United States Patent
Ikuta et al.

(10) Patent No.: US 7,477,118 B2
(45) Date of Patent: Jan. 13, 2009

(54) HIGH FREQUENCY DEVICE MOUNTING SUBSTRATE AND COMMUNICATIONS APPARATUS

(75) Inventors: Takanori Ikuta, Kyoto (JP); Wataru Koga, Kyoto (JP); Hiroki Kan, Kyoto (JP); Yuuko Yokota, Kyoto (JP)

(73) Assignee: Kyocera Corporation, Kyoto (JP)

( * ) Notice: Subject to any disclaimer, the term of this patent is extended or adjusted under 35 U.S.C. 154(b) by 386 days.

(21) Appl. No.: 11/335,195

(22) Filed: Jan. 19, 2006

(65) Prior Publication Data
US 2007/0069834 A1    Mar. 29, 2007

(30) Foreign Application Priority Data
Jan. 20, 2005 (JP) ............................. 2005-012430
Feb. 24, 2005 (JP) ............................. 2005-049191

(51) Int. Cl.
*H01P 3/08* (2006.01)
*H03H 9/00* (2006.01)
*H01R 12/14* (2006.01)
*H01R 12/30* (2006.01)

(52) U.S. Cl. ................... 333/246; 333/186; 333/238; 333/260

(58) Field of Classification Search ............ 333/133, 333/238, 246, 247, 254
See application file for complete search history.

(56) References Cited

U.S. PATENT DOCUMENTS

| | | | |
|---|---|---|---|
| 5,424,693 A * | 6/1995 | Lin .................. 333/33 |
| 5,923,234 A * | 7/1999 | Holzman et al. ............. 333/238 |
| 6,175,287 B1 * | 1/2001 | Lampen et al. ............. 333/247 |
| 6,351,194 B2 * | 2/2002 | Takahashi et al. ............ 333/133 |
| 6,528,924 B1 | 3/2003 | Stelzl et al. ............. 310/313 R |
| 6,722,030 B1 | 4/2004 | Stelzl et al. ................. 700/103 |
| 6,891,266 B2 * | 5/2005 | Kinayman et al. .......... 257/724 |
| 6,911,733 B2 * | 6/2005 | Kikuchi et al. ............. 257/728 |
| 2003/0015785 A1 * | 1/2003 | Yamamura .................. 257/691 |
| 2003/0117238 A1 * | 6/2003 | Takeishi et al. ............. 333/187 |

FOREIGN PATENT DOCUMENTS

| | | |
|---|---|---|
| JP | 11-510666 | 9/1999 |
| JP | 2002-504773 | 2/2002 |
| JP | 2002-257878 | 9/2002 |

* cited by examiner

*Primary Examiner*—Dean O Takaoka
(74) *Attorney, Agent, or Firm*—Hogan & Hartson LLP

(57) ABSTRACT

Terminal electrodes 9 for carrying a high frequency device 3 are formed on a surface of a circuit board having its reverse surface covered with a reverse surface conductor layer 6, and a plurality of signal lines 2 for exchanging a signal between the high frequency device 3 and an external circuit are formed thereon. The terminal electrode 9 is arranged at the center of the circuit board, and the signal lines 2 radially extends from the terminal electrode 9. Electromagnetic interference between the signal lines 2 can be reduced, so that out-of-band attenuation characteristics and isolation characteristics can be satisfactorily exhibited in a case where the high frequency device 3 is a duplexer.

24 Claims, 13 Drawing Sheets

C-C'

C-C'

D-D'

E-E'

E-E'

HIGH FREQUENCY DEVICE MOUNTING SUBSTRATE AND COMMUNICATIONS APPARATUS

BACKGROUND OF THE INVENTION

1. Field of the Invention

The present invention relates to a substrate for mounting a high frequency device, and more particularly, to a high frequency device mounting substrate suited to mount a frequency filter or a transmission-receiving branching filter (hereinafter referred to as a duplexer) serving as a high frequency device employed for a mobile communications apparatus.

The present invention relates to a communications apparatus on which the high frequency device mounting substrate is carried.

The present invention relates to a method of evaluating the characteristics of a high frequency device mounted on the high-frequency device mounting substrate.

2. Description of Related Art

In recent years, for frequency filters such as surface acoustic wave filters employed for mobile communications apparatuses such as cellular phones, requests that they should be small in size and light in weight, loss low inside passbands, be high in attenuation outside the passbands, and steeply change in characteristic from the inside to the outside of the passbands have become strong.

For duplexers that separate signals in transmission-side frequency bands (e.g., on the side of relatively low frequencies) and signals in receiving-side frequency bands (e.g., on the side of relatively high frequencies), requests that they should be small in size and light in weight, loss low in transmission bands and be high in attenuation in receiving bands in transmitting frequency filters within the duplexers, and loss low in receiving bands and be high in attenuation in transmission bands in receiving frequency filters within the duplexers have been also made. In the duplexers, it has been requested that isolation characteristics from transmission terminals to receiving terminals should be good in order to prevent transmission signals from leaking from the transmission terminals to the receiving terminals. As the duplexers, smaller-sized devices having low frequency band-side frequency filters, for example, serving as transmitting frequency filters and high frequency band-side frequency filters, for example, serving as receiving frequency filters integrated therein have been requested.

If high frequency devices that do not meet the above-mentioned requests are used for communications apparatuses, unnecessary radio signals are transmitted or received. Therefore, the qualities of the received radio signals may be degraded, and problems such as jamming to other radio communications apparatuses may occur.

In order to evaluate the characteristics of the above-mentioned high frequency devices such as the frequency filters and the duplexers, the high frequency devices have been carried on mounting substrates for evaluation to measure and evaluate whether or not desired characteristics are obtained.

Since the measurement and evaluation must be accurately made, connection between the high frequency devices and high frequency device mounting substrates and connection between high frequency device mounting substrates and coaxial connectors for connecting the high frequency device mounting substrates and coaxial cables connected to measuring equipments must be respectively firmly made with reliable conductivities ensured using solder.

FIG. 22 is a schematic perspective view showing a general high frequency device mounting substrate, and a high frequency device and a coaxial connecter that are connected thereto.

In the high frequency device mounting substrate, a required electrical circuit is formed of a conductor on a surface of a circuit board 50 having a plurality of insulator layers (not shown) laminated therein and having ground conductor layers (not shown) formed in their inner parts.

The electrical circuit comprises terminal electrodes (not shown) for mounting a high frequency device 41 to be evaluated, signal electrodes 23 and ground electrodes 24 for connecting a coaxial connector mounted so as to connect a cable connected to a measuring equipment and the high frequency device mounting substrate, and a signal line 2 for connecting the terminal electrode for the high frequency device 41 and the signal electrode 23 to each other.

A grounding effect may, in some cases, be increased by providing a through hole 47 penetrating the insulator layers in the circuit board 50 and also providing a conductor layer on an inner surface of the through hole 47 to electrically connect the ground conductor layers to one another, to reduce the parasitic inductance of the ground electrode 24.

The coaxial connector generally comprises a center conductor 44 for transmitting a signal, an outer peripheral conductor 45 surrounding the center conductor 44 and grounded, and an insulating member for insulating the center conductor 44 and the outer peripheral conductor 45. The center conductor 44 has a shape projecting from the insulating member such that it can be connected to the signal electrode 23 in the high frequency device mounting substrate and has a thickness conforming to the width of the signal electrode 23.

In order to assemble the respective members as shown in FIG. 22, cream solder is first applied to terminal electrodes formed on the circuit board 50, the high frequency device 41 having electrodes provided at its position corresponding to the terminal electrodes is carried thereon, and the high frequency device mounting substrate and the high frequency device 41 are connected to each other by reflowing, and the signal electrode 23 and the ground electrode 24 and the center conductor 44 and the outer peripheral conductor 45 are then respectively connected to each other using wire solder and a soldering iron.

The coaxial connector is connected to the coaxial cable connected to the measuring equipment, to measure the characteristics of the high frequency device 41.

In order to remove the coaxial connector from the high frequency device mounting substrate, the high frequency device mounting substrate must be heated to a temperature at which solder is melted (200° C. to 300° C.) to remove the high frequency device 41 using tweezers or the like.

In recent years, the high frequency devices have been progressively reduced in size and weight and correspondingly, the heat capacities of the devices themselves have been reduced, so that heat resistance has been degraded. When the coaxial connectors must be mounted and removed, as described above, therefore, there have been requests to complete mounting and removal thereof in a shorter heating time period than the conventional working time period.

Furthermore, even in the case of not only making measurement and evaluation, as described above, but also carrying high frequency device mounting substrates on communications apparatuses such as base stations and terminals to actually put the high frequency device mounting substrates into practice, the coaxial connectors for connecting the high frequency device mounting substrates and other circuit components must be firmly connected to the high frequency device mounting substrates using solder. When the connection is weak, the certainty of conductivity is lost, so that the reliability of the operations of the high frequency devices are degraded.

Therefore, an object of the present invention is to provide a high frequency device mounting substrate capable of satisfactorily exhibiting the characteristics of a carried high frequency device.

Another object of the present invention is to provide a high frequency device mounting substrate capable of ensuring firm connection with a coaxial connector and capable of simply removing the coaxial connector.

Still another object of the present invention is to provide a high frequency device characteristics evaluating method in which the characteristics of a high frequency device mounted on a high frequency device mounting substrate can be evaluated with high reliability.

SUMMARY OF THE INVENTION

A high frequency device mounting substrate according to the present invention is characterized by comprising a circuit board having a conductor layer on a reverse surface or an inner part of an insulator layer; a plurality of terminal electrodes located on a surface of the circuit board for carrying a high frequency device; and a plurality of signal lines located on the circuit board and respectively connecting with the terminal electrodes, and in that the signal lines respectively radially extending from the terminal electrodes, a straight line that is a virtual extension of the one arbitrary signal line from the terminal electrode and a straight line that is a virtual extension of the other one arbitrary signal line from the terminal electrode not constituting a same straight line.

The two extensions may cross each other at one point and may be parallel to each other.

The terminal electrode may be arranged at an arbitrary position of the circuit board. For example, the terminal electrode may be arranged at a center portion of the circuit board.

According to the high frequency device mounting substrate, the signal lines respectively radially extend from the terminal electrodes, so that portions, in close proximity to each other, of the adjacent signal lines can be shortened, so that electromagnetic coupling between the signal lines can be reduced. Since the signal lines differ in direction, a signal that has linearly propagated on each of the signal lines does not easily propagate to the other signal line (generally in a quasi-TEM wave that is a transmission mode of a microstrip line, when the respective directions of extensions of two signal lines constitute the same straight line, a signal most easily propagates between the signal lines)

Accordingly, the present invention can satisfactorily exhibit, in a case where a frequency filter or a duplexer is used as the high frequency device, its out-of-band attenuation characteristics and isolation characteristics.

It is preferable that ground conductor layers are located on both sides of the signal line on the surface of the circuit board, and a gap W between the signal line and the ground conductor layer is larger than the distance t between the signal line and the conductor layer formed on the reverse surface or the inner part of the insulator layer.

An area between the signal line and the ground conductor layer is filled with a half-and-half mixture of air and a dielectric having a higher dielectric constant than that of the air, while an area between the signal line and the conductor layer is filled with the dielectric having a higher dielectric constant than that of the air. An electric field is easily concentrated between the signal line and the conductor layer.

An electromagnetic field generated around the signal line can be trapped within the insulator layer between the signal line and the opposite conductor layer on the reverse surface by making thee distance t between the signal line and the conductor layer smaller than the gap W between the signal line and the ground conductor layer.

Consequently, electromagnetic interference within the air between the signal lines located on the surface of the mounting substrate can be reduced. In a case where the frequency filter or the duplexer is used as the high frequency device, the effect on the measurement of out-of-band attenuation and isolation characteristics and obstacles to exhibition thereof can be further improved.

In a case where a plurality of through conductors that penetrate the circuit board and are electrically connected to the conductor layer formed on the reverse surface or the inner part of the insulator layer are formed, the ground conductor layers arranged on both sides of the signal line are electrically connected to each other through the through conductor and the conductor layer on the reverse surface or the inner part, so that a potential difference can be eliminated between the ground conductor layers. Accordingly, the ground potential on the ground conductor layer on the surface of the circuit board can be stabilized, and the interference between the signal lines through the ground conductor layer can be reduced. In a case where the frequency filter or the duplexer is used as the high frequency device, therefore, the out-of-band attenuation characteristics and the isolation characteristics thereof can be further satisfactorily measured and evaluated, or the characteristics can be exhibited.

When the high frequency device is a piezoelectric filter, the effect on the out-of-band attenuation characteristics of the piezoelectric filter can be improved, as compared with that in the conventional high frequency device mounting substrate, by forming signal lines respectively extending from an input terminal and an output terminal of the piezoelectric filter, as described above. Moreover, even if the piezoelectric filter highly miniaturized is used, superior out-of-band attenuation characteristics can be maintained.

When the high frequency device is a branching filter using a piezoelectric filter, electromagnetic coupling among signal lines respectively extending from a transmitting terminal, an antenna terminal, and a receiving terminal in the branching filter can be restrained. Therefore, it is possible to realize the mounting substrate that is superior in out-of-band attenuation characteristics in each of a transmitting frequency filter and a receiving frequency filter in the branching filter, and in which high isolation characteristics are obtained. Moreover, even if the branching filter highly miniaturized is used, superior out-of-band attenuation characteristics and isolation characteristics can be maintained.

A piezoelectric filter carried as a high frequency device on the high frequency device mounting substrate according to the present invention and a branching filter using the same may be devices such as a device using a surface acoustic wave and a device using a so-called FBAR (Film Balk Acoustic Resonator) using a bulk wave. The effect of the present invention is effective for all miniaturized frequency filters and branching filters.

The high frequency device mounting substrate according to the present invention can be also suitably employed for composing a circuit module such as a module substrate for integrating and miniaturizing an RF portion of the communications apparatus, or a circuit board actually used for a mobile communications apparatus or the like.

The high frequency device mounting substrate according to the present invention can be also suitably employed for measuring and evaluating the high frequency device, as described later.

Then, a high frequency device mounting substrate according to the present invention comprises a circuit board having a conductor layer on a reverse surface or an inner part of an insulator layer; a terminal electrode located on a surface of the circuit board for carrying a high frequency device; a signal line located on the surface of the circuit board and connecting with the terminal electrode; a signal electrode arranged in a peripheral part on the surface of the circuit board and connecting with the signal line, to which a center conductor in a coaxial connector is connected; and a ground electrode arranged in the peripheral part on the surface of the circuit board for connecting an outer peripheral conductor in the coaxial connector using solder, the ground electrode having a through hole that penetrates the circuit board formed in its region to which the solder adheres, and an inner surface of the through hole being coated with the conductor layer.

According to the high frequency device mounting substrate, when the outer peripheral conductor in the coaxial connector is mounted using the solder, the solder flows into the through hole. Consequently, the outer peripheral conductor in the coaxial connector can be firmly joined to the ground electrode in the circuit board.

In a state where a parasitic inductance is smaller, as compared with that in a case where the through hole 47 is provided in a portion close to the high frequency device 41 in the circuit board 50, as in FIG. 22 in the conventional example, the internal ground conductor layer can be connected to the ground potential in the measuring equipment, so that the characteristics of the high frequency device can be more accurately measured.

An effect produced in mounting the coaxial connector in the high frequency device mounting substrate according to the present invention, as described above, on the high frequency device mounting substrate is also effective in not only a case where the coaxial connector and the high frequency device mounting substrate are temporarily connected to each other and the coaxial connector is removed after the measurement but also a case where a so-called main board requiring permanent connection and a connector for connecting the main board and an external circuit are connected to each other.

Even in a case where the coaxial connector is removed from the high frequency device mounting substrate, as described later, the effect is effective in a case where repair is required in the connection between the main board requiring permanent connection and the connector.

The circuit board may be a laminated substrate having a plurality of insulator layers laminated therein and may have an internal conductor layer formed in its inner part, and a conductor layer formed on the inner surface of the through hole may be connected to the internal conductor layer.

It is preferable that a second ground electrode is formed in an area corresponding to the ground electrode on the reverse surface of the circuit board, and the second ground electrode is connected to the ground electrode through the conductor layer formed on the inner surface of the through hole.

In this configuration, the solder continuously exists to the second ground electrode through the through hole, so that the coaxial connector can be more firmly connected. In addition thereto, in the case of solder connection, heat generated by the soldering iron is quickly conducted from the solder existing on one of the surfaces (e.g., a surface) to the solder existing on the other surface (e.g., a reverse surface) through the solder within the through hole, so that the solders on both the surfaces can be simultaneously melted. Therefore, the respective quantities of the solders on both the surfaces can be equalized through the though hole.

In a case where the coaxial connector is removed, the solders on both the surfaces can be also simultaneously melted, so that removal work can be easily completed in a short time period. Consequently, the carried high frequency device can be removed without degrading the characteristics thereof. The coaxial connector and the high frequency device mounting substrate can be reused without being damaged by heat.

In a case where a plurality of through holes are arranged in an area, along the outer periphery of the circuit board, in the ground electrode, an electrical path of the outer peripheral conductor in the coaxial connector, the conductor layer within the through hole, and the internal conductor layer that are connected to one another by the solder can be made the shortest, so that a parasitic inductance due to the conductor layer within the through hole can be made the smallest.

When the through hole is further arranged from the outer periphery of the circuit board toward the center thereof in an area, on the opposite side of the signal line, in the ground electrode, the following effect is produced.

In the conventional high frequency device mounting substrate, when the quantity of the solder is made large in order to firmly connect the coaxial connector, the signal electrode and the ground electrode that are arranged close to each other may, in some cases, be short-circuited through the solder. According to the high frequency device mounting substrate in the present invention, however, when the through hole is further arranged from the outer periphery of the circuit board toward the center thereof in an area on the opposite side of the signal line in the ground electrode, an extra solder for the ground electrode on the surface flows into the second ground electrode on the reverse surface through the further arranged through hole. Thus, the solder is situated slightly nearer the opposite side of the signal line in the ground electrode. Therefore, it can be difficult for the solder to be used to flow toward the signal electrode, so that the signal electrode and the ground electrode can be effectively prevented from being short-circuited through the solder.

In a case where the surface ground conductor layer formed along the signal line on the surface of the circuit board is connected to the ground electrode, the surface ground conductor layer can be connected to the ground electrode in the measuring equipment in a state where the parasitic inductance is the smallest. Therefore, a potential at one, to be grounded, of signal terminals in the high frequency device can be brought closer to the ground potential in the measuring equipment.

The high frequency device mounting substrate according to the present invention can be suitably employed for not only measuring and evaluating the high frequency device but also composing a circuit module such as a module substrate for integrating and miniaturizing an RF portion of the communications apparatus, or a circuit board actually used for a mobile communications apparatus or the like.

A method of evaluating the characteristics of a high frequency device according to the present invention is a method comprising the steps of mounting the high frequency device on the high frequency device mounting substrate in which signal lines respectively radially extend from terminal electrodes, connecting measuring wiring to the high frequency device mounting substrate, and inspecting the characteristics of the high frequency device mounted on the high frequency device mounting substrate. In this method, the signal lines respectively radially extend from the terminal electrodes in the high frequency device mounting substrate, so that electromagnetic coupling between the signal lines is reduced, so that the characteristics of the high frequency device can be accurately measured.

A method of evaluating the characteristics of a high frequency device according to the present invention comprises the steps of mounting the high frequency device on the high frequency device mounting substrate on which the coaxial connector can be mounted, connecting a coaxial connector to the high frequency device mounting substrate using solder; and inspecting the characteristics of the high frequency device mounted on the high frequency device mounting substrate. According to this method, the characteristics of the high frequency device can be evaluated by reliably connecting the coaxial connector to the high frequency device mounting substrate, and the high frequency device can be simply removed.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Figure 1:
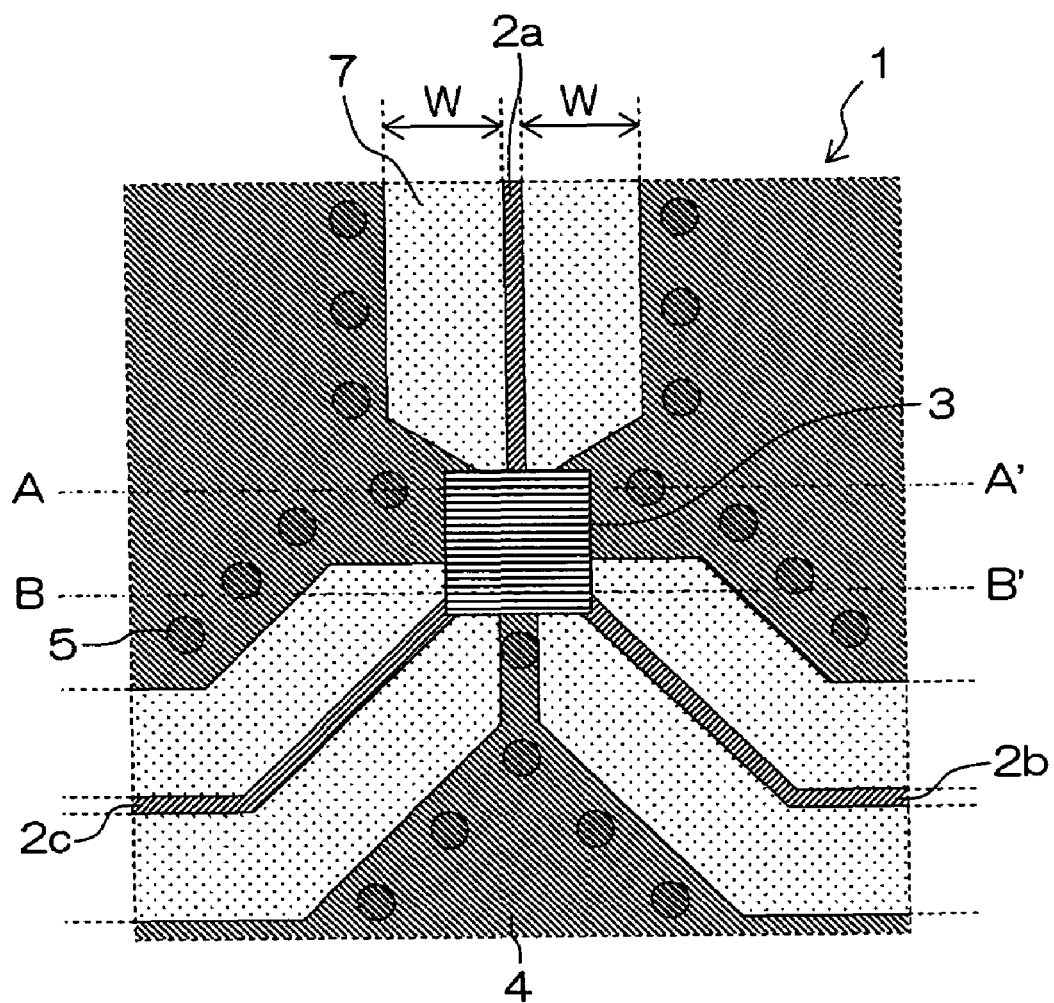
FIG. 1 is a plan view showing a state where a high frequency device is carried on a high frequency device mounting substrate according to the present invention.
Figure 2:
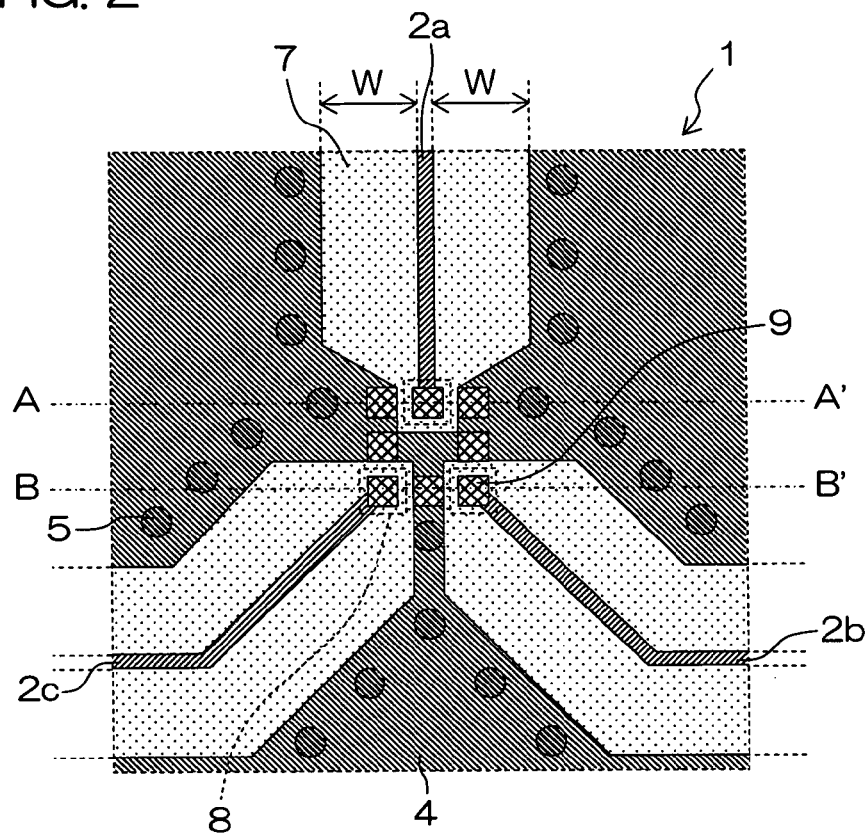
FIG. 2 is a plan view of the high frequency device mounting substrate according to the present invention.

FIGS. 1 and 2 illustrate an example of a high frequency device mounting substrate according to the present invention.

FIG. 1 is a plan view showing a state where a duplexer 3 serving as a high frequency device is carried on a high frequency device mounting substrate 1. FIG. 2 is a plan view showing only a high frequency device mounting substrate 1 on which a duplexer 3 is not carried.

The high frequency device mounting substrate 1 is composed of a circuit board including an insulator layer 7. The duplexer 3 is carried on a surface of the insulator layer 7. The duplexer 3 comprises at least a transmitting frequency filter and a receiving frequency filter (both are not shown).

A plurality of terminal electrodes 9 to be connected to the duplexer 3 are located in correspondence with the electrode arrangement of the duplexer 3 on the surface of the insulator layer 7 in the circuit board.

A surface ground conductor layer 4 and a plurality of signal lines 2a to 2c (generically referred to as "signal lines 2") are located on the surface of the insulator layer 7 in the circuit board.

Each of the signal lines 2 is connected to the predetermined terminal electrode 9, and radially extends from the terminal electrode 9.

The surface ground conductor layer 4 is connected to the other predetermined terminal electrode 9.

Thus, some of the terminal electrodes 9 are connected to the signal lines 2, and the others are connected to the surface ground conductor layer 4.

Figure 3:
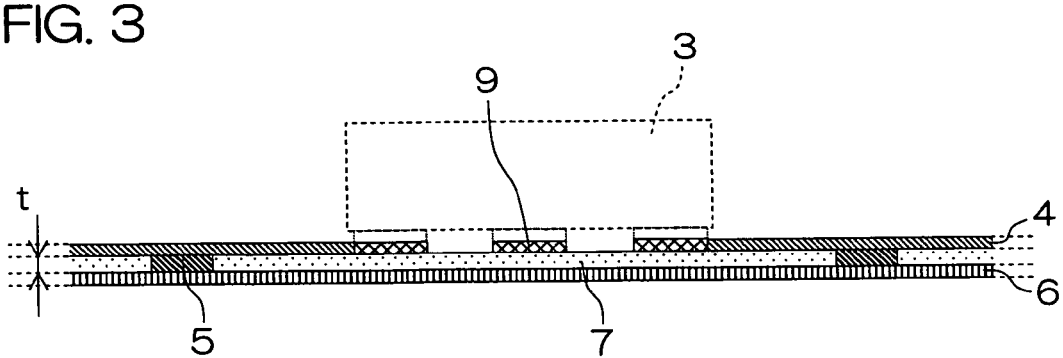
FIG. 3 is a cross-sectional view of a principal part cut along a line A-A' shown in FIG. 1.

A reverse surface of the insulator layer 7 is covered with a reverse surface conductor layer 6 (see FIG. 3)

As shown in FIGS. 1 and 2, the ground conductor layer 4 is arranged on both sides of each of the signal lines 2 radially extending. The surface ground conductor layer 4 is located with gaps W respectively provided on both sides of the signal line 2 on the surface of the insulator layer 7. The gap W is made wider than a distance t (see FIG. 3) between the signal line 2 and the reverse surface conductor layer 6.

Reference numeral 5 denotes a through conductor. A plurality of through conductors are arranged along a side, close to the signal line 2, of the surface ground conductor layer 4. The through conductors 5 are for connecting the surface ground conductor Layer 4 and the reverse surface conductor layer 6 on the insulator layer 7 to each other. The through conductors 5 may be so-called through hole conductors each formed with an inner wall of a through hole provided in the insulator layer 7 coated with a conductor or may be so-called via conductors each formed with an inner part of a through hole filled with a conductor.

FIG. 3 is a cross-sectional view of a principal part cut along a line A-A' shown in FIG. 1.

As shown in FIG. 3, the reverse surface conductor layer 6 on the insulator layer 7 is electrically connected to the surface ground conductor layer 4 on the surface of the insulator layer 7 by the through conductor 5. The reverse surface conductor layer 6 is grounded by being connected to a grounding outer peripheral conductor in a connector with solder at a connector mounting portion on an end surface of the high frequency device mounting substrate 1 for connecting the signal lines 2 to an external measuring equipment or the like, so that a ground potential on the surface ground conductor layer 4 is stabilized.

In the embodiment shown in FIGS. 1 to 3, the terminal electrodes 9 are arranged at the center of the insulator layer (circuit board) 7, and the signal lines 2 respectively radially extend from the terminal electrodes 9, as shown in FIG. 2, so that the length of portions, in close proximity to each other, of the signal lines 2 can be shortened. Therefore, electromagnetic interference between the signal lines 2 can be reduced.

Particularly as shown in FIGS. 1 and 2, the signal lines 2 radially extending are respectively disposed with the terminal electrodes 9 sandwiched therebetween. That is, the terminal electrode 9 is disposed so as to terminate the signal line 2 radially extending. In addition thereto, a straight line that is a virtual extension of the one arbitrary signal line 2 from the terminal electrode 9 and a straight line that is a virtual extension of the other one arbitrary signal line 2 from the terminal electrode 9 shall not constitute the same straight line.

Therefore, a signal that has linearly propagated through the signal line is not easily moved to the other signal line, so that electromagnetic interference between the signal lines can be restrained. Therefore, superior out-of-band attenuation characteristics and isolation characteristics can be maintained.

Although the surface ground conductor layer 4 is located on both sides of the signal line 2, an area between the signal line 2 and the surface ground conductor layer 4 is filled with air and a dielectric (e.g., glass epoxy resin; a relative dielectric constant 4.7). On the other hand, an area between the signal line 2 and the reverse surface conductor layer 6 is all filled with a dielectric. Therefore, an electric field is easily concentrated between the signal line 2 and the reverse surface conductor layer 6.

Particularly, the gap W between the signal line 2 and the surface ground conductor layer 4 is made larger than the distance t between the signal line 2 and the reverse surface conductor layer 6 so that the electric field is more significantly concentrated.

Accordingly, a distribution of electromagnetic fields generated around the signal line can be prevented from spreading, which makes it difficult for a signal to interfere with the adjacent signal line 2 by leaking to the air. Consequently, interference between the adjacent signal lines 2 can be satisfactorily restrained, so that superior out-of-band attenuation characteristics and isolation characteristics can be maintained.

Specifically, when the duplexer 3 in the 800 MHz band is mounted on the high frequency device mounting substrate 1 in which the signal line 2 having a width of 0.13 mm is arranged on the insulator layer 7 having a thickness t of 0.1 mm and the surface ground conductor layer 4 is provided with a gap W of 1 mm from the signal line 2, to evaluate the characteristics thereof, isolation characteristics in a transmission band become −70 dB. When the ratio of the thickness t to of the insulator layer 7 to the gap W between the signal line 2 and the surface ground conductor layer 4 is 1:1, the isolation characteristics become −60 dB. From a comparison therebetween, the isolation characteristics are improved by approximately 10 dB by setting the ratio of the thickness t of the insulator layer 7 to the gap W between the signal line 2 and the surface ground conductor layer 4 to 1:10.

Since the plurality of through conductors 5 electrically connected to the reverse surface conductor layer 6 are connected to the ground conductor layers 4 arranged on both sides of the signal line 2, the surface ground conductor layers 4 are electrically connected to each other through the through conductors 5 and the reverse surface conductor layer 6. Accordingly, the surface ground conductor layers 4 on both sides of the signal line 2 are at the same potential so that a potential difference can be eliminated between the surface ground conductor layers 4, which allows the ground potential on the surface ground conductor layer 4 to be stabilized. Consequently, interference between the signal lines 2 with the surface ground conductor layer 4 sandwiched therebetween can be reduced, so that the characteristics of the high frequency device 3 can be improved.

Specifically, via conductors having a diameter of 0.3 mm are arranged at spacing of 0.7 mm as the through conductors 5 along the side, on the side of the signal line 2, of the surface ground conductor layer 4, so that the isolation characteristics can be improved by approximately 5 dB, as compared with those in a case where there is no through conductor 5.

According to the above-mentioned high frequency device mounting substrate 1, when the high frequency device 3 is the duplexer, desired characteristics can be obtained without degrading the out-of-band attenuation characteristics and the isolation characteristics of the transmitting frequency filter and the receiving frequency filter in the duplexer 3.

If the high frequency device mounting substrate 1 is used as a high frequency module, the function thereof can be improved by exhibiting the characteristics of the high-frequency device such as the duplexer 3 as desired.

When the high frequency device 3 is a piezoelectric filter, a ground potential on the surface mounting conductor layer 4 is stabilized. Consequently, interference between the signal lines 2 with the surface ground conductor layer 4 sandwiched therebetween can be reduced, so that the out-of-band attenuation characteristics can be satisfactorily maintained.

The number of signal lines 2 and the location angle thereof are not limited to those shown in FIGS. 1 and 2.

Figure 4:
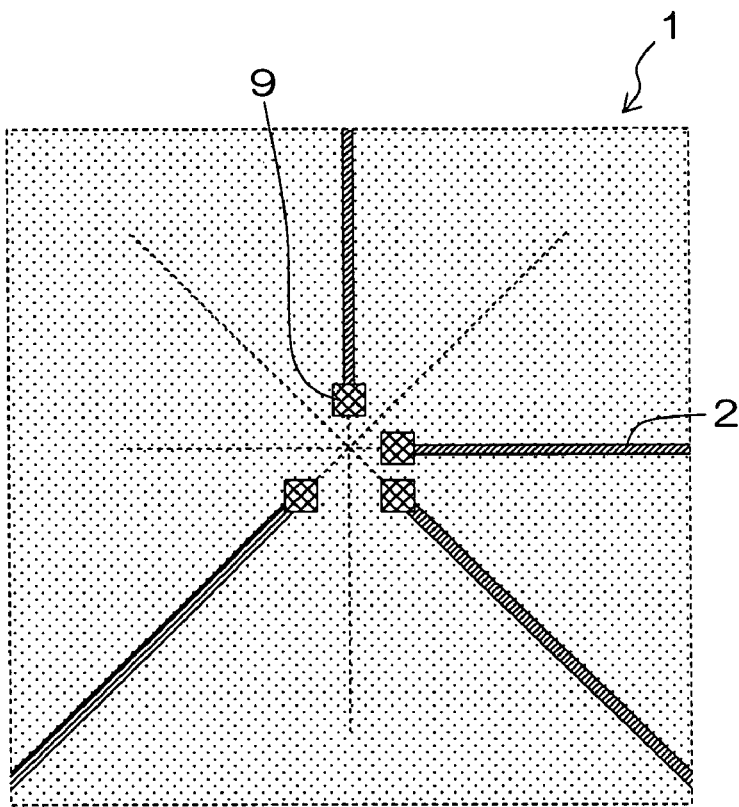
FIG. 4 is a plan view of the high frequency device mounting substrate according to the present invention, in which the number of signal lines 2 and the location angle thereof are changed.

Although in FIGS. 1 and 2, three signal lines 2 are arranged at an equal angle, four signal lines 2 may be radially arranged, as shown in FIG. 4, for example. An angle between the signal lines 2 need not necessarily be an equal angle.

In this case shown in FIG. 4, a straight line that is a virtual extension of the one arbitrary signal line 2 from the terminal electrode 9 and a straight line that is a virtual extension of the other one arbitrary signal line 2 from the terminal electrode 9 cross each other at one point.

Figure 5:
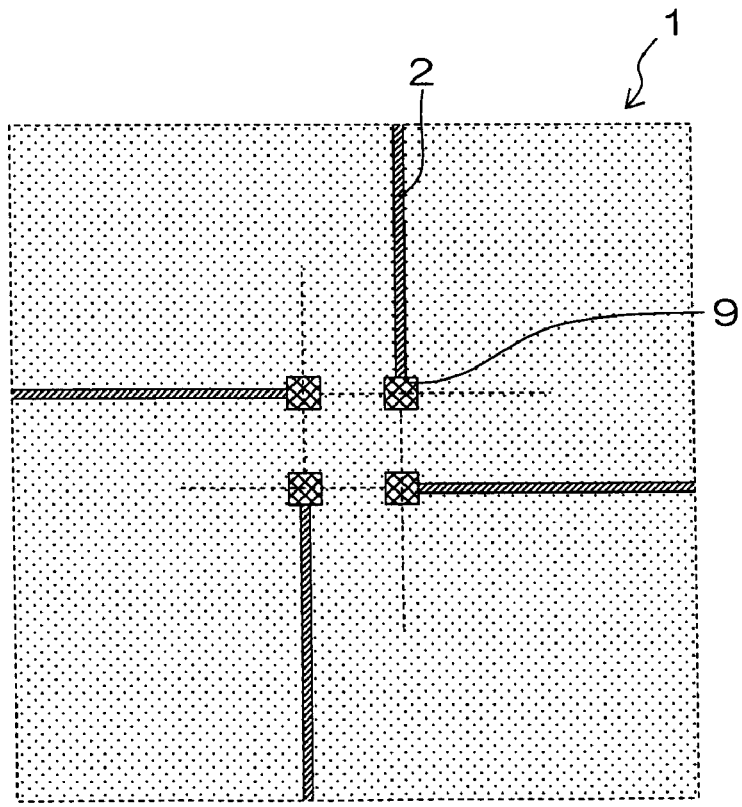
FIG. 5 is a plan view of the high frequency device mounting substrate according to the present invention, in which the number of signal lines 2 and the location angle thereof are changed.

As shown in FIG. 5, the signal lines 2 may be arranged radially and parallel to one another. In this case, a straight line that is a virtual extension of the one arbitrary signal line 2 from the terminal electrode 9 and a straight line that is a virtual extension of the other one arbitrary signal line 2 from the terminal electrode 9 are parallel to each other.

Even in the case shown in FIGS. 4 and 5, a signal that has linearly propagated through the signal line 2 is not easily coupled to the other signal line 2, as in the configuration shown in FIGS. 1 and 2, so that electromagnetic interference between the signal lines 2 can be restrained. Therefore, superior out-of-band attenuation characteristics and isolation characteristics can be maintained.

Figure 6:
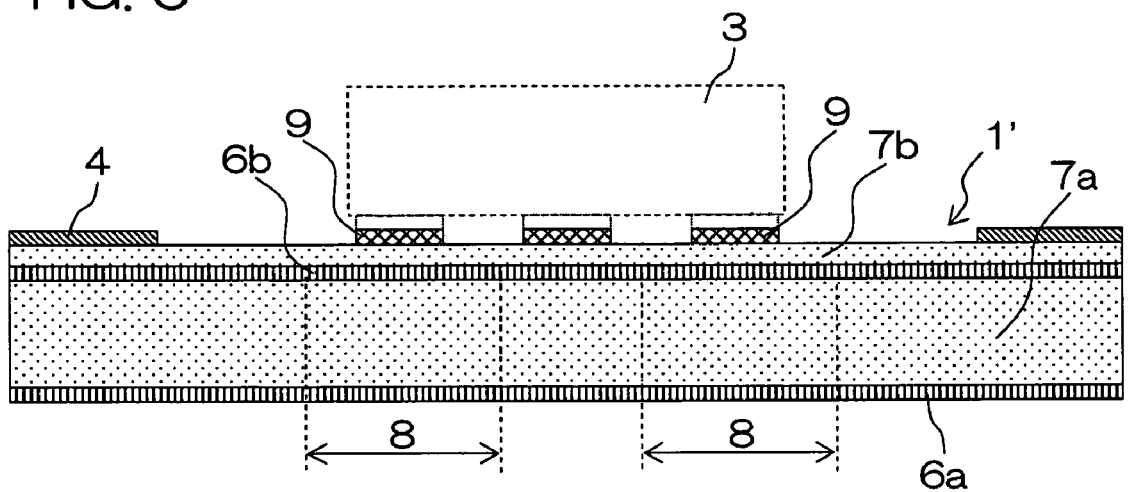
FIG. 6 is a cross-sectional view of a principal part cut along a line B-B' shown in FIG. 1.

FIG. 6 is a cross-sectional view of a principal part showing another configuration of the high frequency device mounting substrate according to the present invention. Further, as a comparative example, FIG. 7 illustrates the configuration of the high frequency device mounting substrate using the same cross-sectional view of a principal part.

The plane shape of the high frequency device mounting substrate is the same as that shown in FIGS. 1 and 2 and hence, the plan view is omitted.

Figure 7:
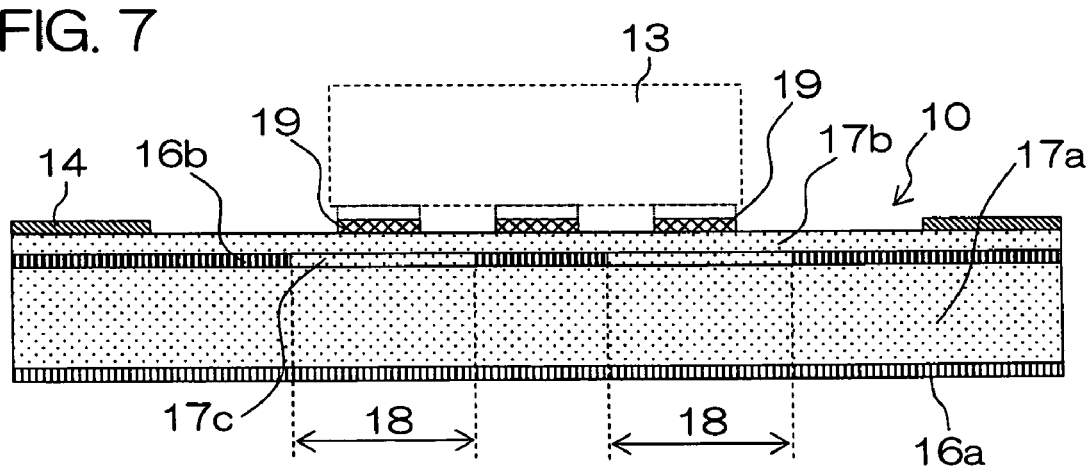
FIG. 7 is a cross-sectional view of a principal part of a high frequency device mounting substrate according to a comparative example.

FIG. 6 is a cross-sectional view of a principal part cut along a line B-B' shown in FIG. 1, and FIG. 7 is also a cross-sectional view of a principal part cut at the same position. In FIG. 6, the same sections as those shown in FIGS. 1 and 2 are assigned the same reference numerals.

In an example of the embodiment of the present invention shown in FIG. 6, a high frequency device mounting substrate 1' is a multilayer circuit board comprising a signal line 2 (not shown), a surface ground conductor layer 4, an insulator layer 7b, a reverse surface conductor layer 6b covering a reverse surface of the insulator layer 7b, an insulator layer 7a laminated on the insulator layer 7b with the reverse surface conductor layer 6b sandwiched therebetween, and a reverse surface conductor layer 6a covering a reverse surface of the insulator layer 7a.

Examples of numerical values are given. The thickness of the insulator layer 7a is 1 mm, and the thickness of the insulator layer 7b is 0.1 mm. The provision of the insulator layer 7a allows the strength of the high frequency device mounting substrate 1' to be increased. Further, another circuit can be also formed on the reverse surface conductor layer 6a.

When an insulator layer is further provided so that a conductor layer has a multilayer structure, a circuit can be further integrated. This integration allows a circuit board used for a mobile communications apparatus such as a cellular phone to be miniaturized.

A high frequency device mounting substrate 10 shown in FIG. 7 is a multilayer circuit board comprising a ground conductor layer 14, an insulator layer 17b, a conductor layer 16b covering a reverse surface of the insulator layer 17b that is patterned to a predetermined pattern shape, an insulator layer 17a laminated on the insulator layer 17b with the conductor layer 16b sandwiched therebetween, and a conductor layer 16a covering a reverse surface of the insulator layer 17a, similarly to the high frequency device mounting substrate 1' shown in FIG. 6.

In the high frequency device mounting substrate 10 shown in FIG. 7, when a conductor layer is provided in a region 18 in the vicinity of an area just below a terminal electrode 19 on which a high frequency device 3 such as a duplexer is mounted, a parasitic capacitance is generated between the terminal electrode 19 and the conductor layer. When the parasitic capacitance is generated in such a way, the characteristic impedance in a portion of the terminal electrode 19 is shifted from 50 Ω. Therefore, a signal is reflected so that characteristics are degraded, so that no conductor layer is provided in the region 18 in the vicinity of the area just below the terminal electrode 19.

Therefore, the conductor layer 16b covering the reverse surface of the insulator layer 17b on which the high frequency device 3 is carried is patterned by providing the conductor layer 16b with a non-formed region in correspondence with the region 18, as shown in FIG. 7 (this patterning may cause the region 18 serving as the non-formed region in the conductor layer 16b to be filled with an insulator 17c).

By thus providing the conductor layer 16b in the vicinity of the area just below the terminal electrode 19 with the non-formed region for the purpose-of preventing the parasitic capacitance from being generated, however, an electric field distribution in the vicinity of the terminal electrode 19 deeply enters the insulator layer 17a through the non-formed region in the conductor layer 16b and is coupled to the conductor layer 16a in the region 18 when the high frequency device 3 is operated. Therefore, an electromagnetic field in a part of the electric field distribution causes such feed-through that a signal leaks to the other terminal electrode 19 through the non-formed region in the adjacent conductor layer 16b.

On the other hand, the high frequency device mounting substrate 1' shown in FIG. 6 is an improvement to this problem. In FIG. 6, the reverse surface conductor layer 6b covering the reverse surface of the insulator layer 7b on which a high frequency device 3 is carried is not subjected to such patterning that its portion corresponding to a region 8 in the vicinity of an area just below a terminal electrode 9 is provided with a non-formed region, as shown in FIG. 7.

Even when the reverse surface conductor layer 6b is not thus provided with the non-formed region, as the size of the terminal electrode 9 itself is small in the significantly miniaturized high frequency device 3, a generated parasitic capacitance can be ignored because it is very small. This prevents a signal from being reflected due to impedance discontinuity caused by generation of a parasitic capacitance between the reverse surface conductor layer 6b and the terminal electrode 9.

Furthermore, the reverse surface conductor layer 6b is not provided with the non-formed region corresponding to the region 8 in the vicinity of the area just below the terminal electrode 9, which prevents an electric field distribution in the vicinity of the terminal electrode 9 from deeply entering the insulator layer 7a through the reverse surface conductor layer 6b when the high frequency device 3 is operated, so that the occurrence of feed-through by coupling with the reverse surface conductor layer 6a can be restrained.

In a case where the high frequency device 3 is a piezoelectric filter, the results of simulation have showed that in the configuration of the high frequency device mounting substrate shown in FIG. 7, the conductor layer 16b is provided with the non-formed region in correspondence with the region 18 in the vicinity of the area just below the terminal electrode 19 so that isolation characteristics between the terminal electrodes 19 are −76.5 dB.

In the configuration in the present invention shown in FIG. 6, the reverse surface conductor layer 6b is not provided with a non-formed region in correspondence with the region 8 in the vicinity of the area just below the terminal electrode 9 so that isolation characteristics between the terminal electrodes 9 in a case where the high frequency device 3 is a piezoelectric filter are −80.4 dB. Therefore, it is found that the effect on the isolation characteristics are significantly improved.

According to the high-frequency device mounting substrate in the present invention, the isolation characteristics between the terminal electrodes 9 are not thus degraded in a case where the high frequency device 3 to be carried is a piezoelectric filter or a branching filter using the piezoelectric filter.

Since the occurrence of the feed-through can be restrained, the out-of-band attenuation characteristics can be satisfactorily maintained.

When the high frequency device 3 is a duplexer, the occurrence of the feed-through can be restrained. Therefore, the out-of-band attenuation characteristics can be satisfactorily maintained by both the transmitting frequency filter and the receiving frequency filter, and the isolation characteristics can be satisfactorily maintained by restraining leakage of a signal from a transmission terminal to a receiving terminal.

Figure 8:
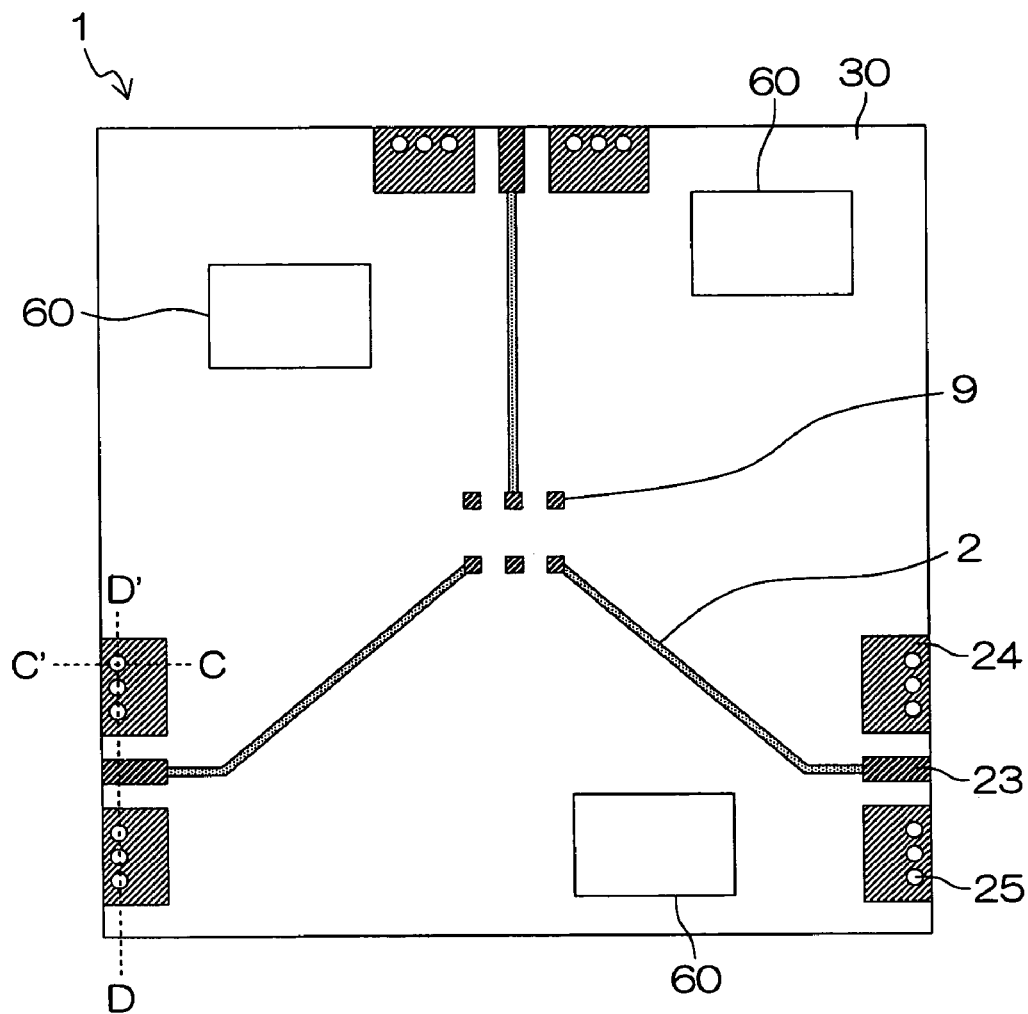
FIG. 8 is a plan view showing another example of the high frequency device mounting substrate according to the present invention.
Figure 9:
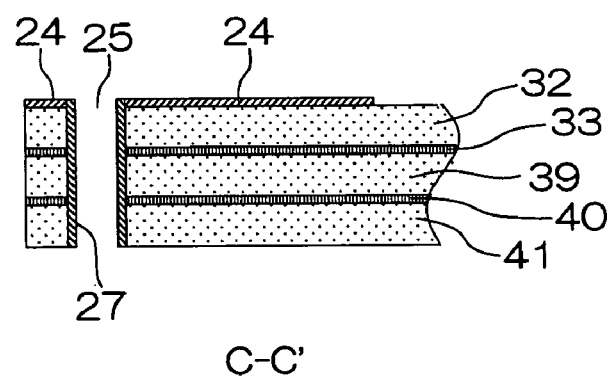
FIG. 9 is a cross-sectional view of a principal part cut along a line C-C' shown in FIG. 8.

FIG. 8 is a plan view showing another example of the high frequency device mounting substrate according to the present invention. FIG. 9 is a cross-sectional view of a principal part cut along a line C-C' shown in FIG. 8.

In a high frequency device mounting substrate 1, a terminal electrode 9 on which a high frequency device is mounted is provided at the center of a surface of a circuit board 30 having a structure in which insulator layers 32, 39, and 41 and ground conductor layers 33 and 40 are laminated. An electronic component 60 such as a resistor, a capacitor, or an integrated circuit is carried on the surface of the circuit board 30.

A signal electrode 23 to which a center conductor (not shown) in a coaxial connector is connected and a ground electrode 24 to which an outer peripheral conductor (not shown) in the coaxial connector is connected with solder are formed in a peripheral part on the surface of the circuit board 30.

The terminal electrode 9 and the signal electrode 23 are connected to each other by a signal line 2 radially extending from the center of the circuit board 30.

Here, through holes 25 are formed along the outer periphery of the circuit board 30 in an area, on the side of the outer periphery of the circuit board 30, in the ground electrode 24.

An inner surface of the through hole 25 is coated with a conductor layer 27, as shown in FIG. 9. The conductor layer 27 electrically connects the ground electrode 24 and the ground conductor layers 33 and 40.

A predetermined terminal to be grounded of the terminal electrode 9 is connected to the ground conductor layer 33 just there below through a via conductor (not shown) filled with a conductor.

In a case where the characteristics of the high frequency device (not shown) are thus measured using the high frequency device mounting substrate 1 according to the present invention, the terminal electrode 9 is first coated with a cream solder or the like, and is heated to not less than the melting temperature of the cream solder by bringing a corresponding terminal (not shown) of the high frequency device into contact therewith. This causes the high frequency device to be mounted on the high frequency device mounting substrate 1.

The center conductor and the outer peripheral conductor in the coaxial connector (not shown) are then respectively joined to the signal electrode 23 and the ground electrode 24 using solder and a soldering iron.

Figure 22:
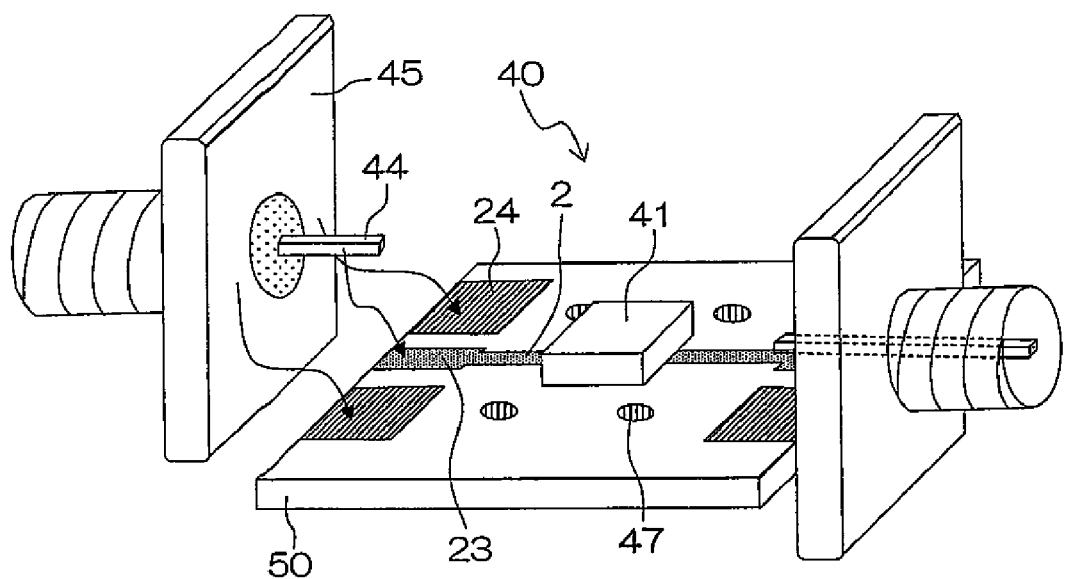
FIG. 22 is a schematic perspective view showing a general high frequency device mounting substrate, and a high frequency device and a coaxial connecter that are connected thereto.

In the case, the existence of the through hole 25 causes the melted solder to flow into the through hole 25 from the ground electrode 24 and enter the through hole 25. In this way, the solder is continuously formed from the inside of the through hole 25 to the outer peripheral conductor 45 (see Fig. 22) in the coaxial connector.

Therefore, firm connection between the high frequency device mounting substrate 1 and the coaxial connector can be ensured. Even if a physical load is applied from a connected cable or the like during measurement, the probability that the center conductor in the coaxial connector and the signal electrode 23 separate from each other can be significantly reduced.

The outer peripheral conductor in the coaxial connector and the ground conductor layers 33 and 40 can be connected to each other at the closest position to a ground electrode in a measuring equipment through the ground electrode 24 and the conductor layer 27 in the through hole 25 in the high frequency device mounting substrate 1. Therefore, a parasitic inductance due to the physical distance between the ground electrode in the measuring equipment and the ground conductor layers 33 and 40 can be reduced. Consequently, the characteristics of the high frequency device can be more accurately measured.

Description is now made of still another example of the embodiment of the present invention.

Although in this example, a plan view of a high frequency device mounting substrate 1 is the same as FIG. 8, a second ground electrode 28 is provided in an area, opposite a ground electrode 24, on a reverse surface of a circuit board 30.

Figure 10:
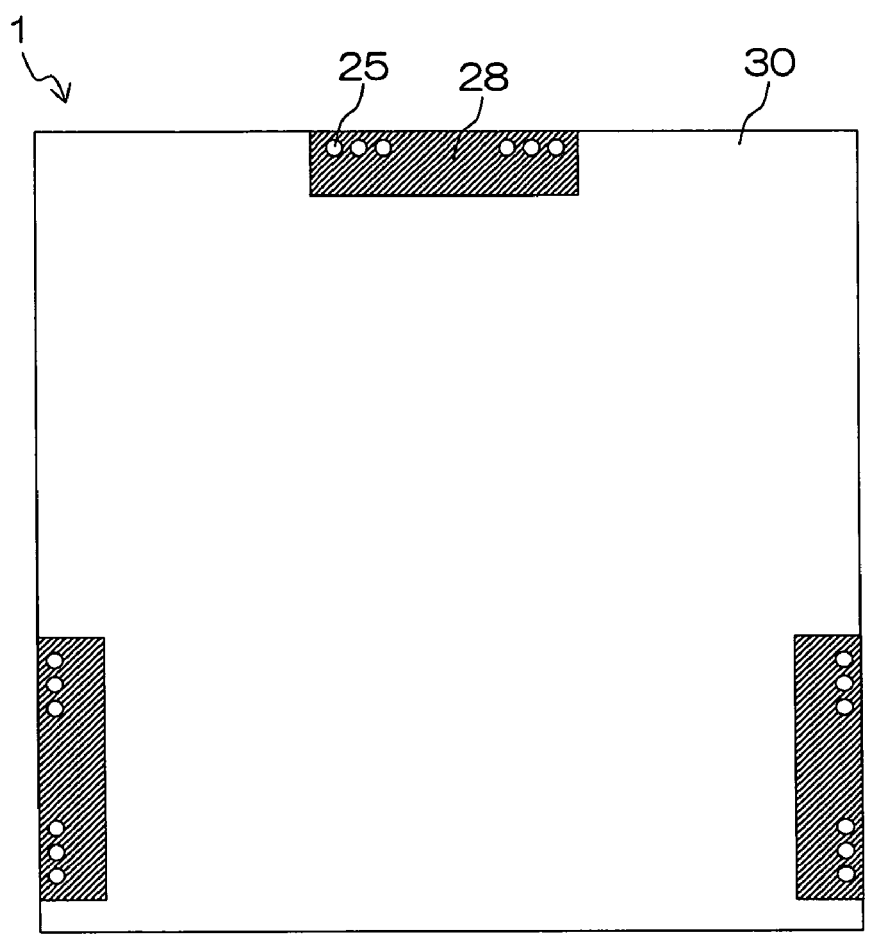
FIG. 10 is a plan view showing a reverse surface of a high frequency device mounting substrate having a second ground electrode 28.
Figure 11:
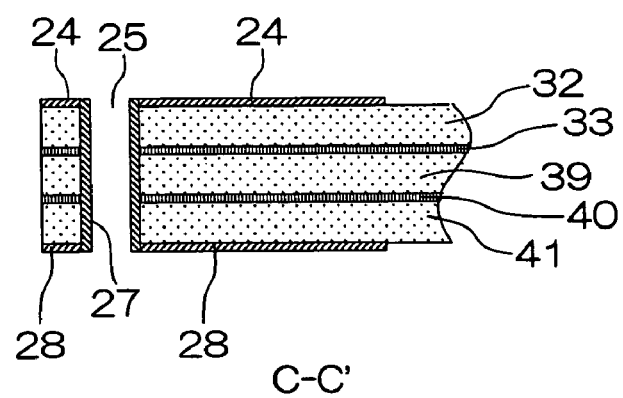
FIG. 11 is a cross-sectional view of a principal part, cut along a line C-C' shown in FIG. 8, of a high frequency device mounting substrate having a second ground electrode 28.

FIG. 10 is a plan view showing a reverse surface of the high frequency device mounting substrate 1 in this example. FIG. 11 is a cross-sectional view of a principal part cut along the line C-C' shown in FIG. 8 in this example. FIG. 11 differs from FIG. 9 in that the second ground electrode 28 is provided on the reverse surface of the high frequency device mounting substrate 1 in FIG. 11.

The second ground electrode 28 is electrically connected to the ground electrode 24 on a surface of the high frequency device mounting substrate 1 and ground conductor layers 33 and 40 in an inner part thereof through a conductor layer 27 on an inner surface of a through hole 25.

Figure 12:
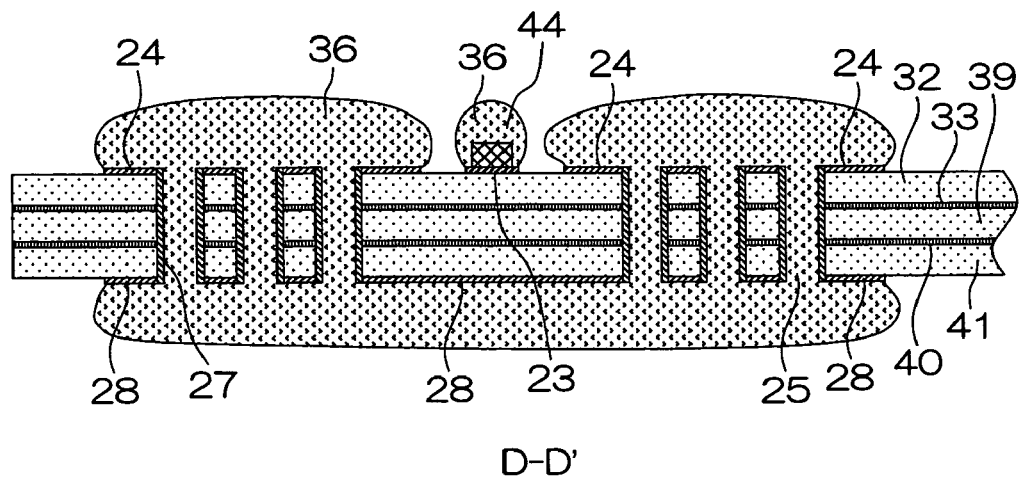
FIG. 12 is a cross-sectional view of a principal part, cut along a line D-D' shown in FIG. 8, in a case where a high frequency device mounting substrate and a coaxial connector are connected to each other with solder.

FIG. 12 is a cross-sectional view of a principal part, cut along the line D-D' shown in FIG. 8, in a case where the high frequency device mounting substrate 1 in this example and a coaxial connector are joined to each other with solder.

As shown in FIG. 12, solder 36 can be caused to continuously exist from the reverse surface of the high frequency device mounting substrate 1 to an outer peripheral conductor (not shown) in the coaxial connector on a surface thereof through a through hole 25. Therefore, the ground electrode 24 in the high frequency device mounting substrate 1 and the outer conductor in the coaxial connector can be more firmly connected to each other.

In a case where the ground electrode 24 and the outer peripheral conductor in the coaxial connector are connected to each other with the solder 36, heat generated by a soldering iron is quickly conducted from the solder 36 existing on the one surface to the solder 36 existing on the other surface through the solders 36 within the through hole 25 so that the solders 36 on both the surfaces can be simultaneously melted. Thus, the respective quantities of the solders on both the surfaces are equalized, so that a stress and a load applied to a center conductor 44 in the coaxial connector and a signal electrode 23 in the high frequency device mounting substrate 1 can be reduced.

In removing the coaxial connector, the solders 36 on both the surfaces can be also simultaneously melted, so that removal work can be easily completed in a short time period. Consequently, the carried high frequency device can be removed without degrading the characteristics thereof. The coaxial connector and the high frequency device mounting substrate 1 can be reused without being damaged.

Since the outer peripheral conductor in the coaxial connector and the ground conductor layer 33 can be connected to each other at the closest position to a ground electrode in a measuring equipment through the ground electrode 24, the second ground electrode 28, and the conductor layer 27 within the through hole 25 in the high frequency device mounting substrate 1. Therefore, a parasitic inductance due to the physical distance between the ground electrode in the measuring equipment and the ground conductor layer 33 can be reduced. Consequently, the characteristics of the high frequency device can be more accurately measured, as in the above-mentioned embodiment.

Description is now made of still another example of the embodiment of the present invention.

Figure 13A:
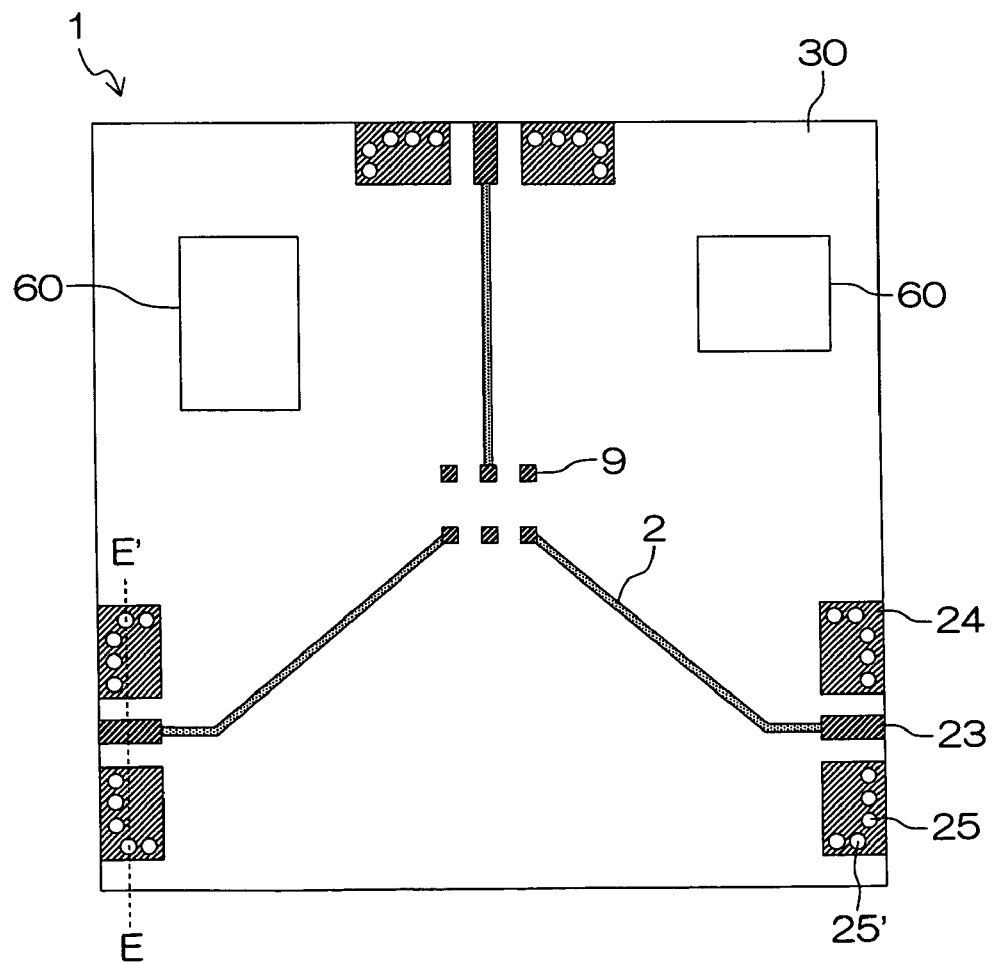
FIG. 13A is a plan view of a surface showing still another example of the high frequency device mounting substrate according to the present invention.
Figure 13B:
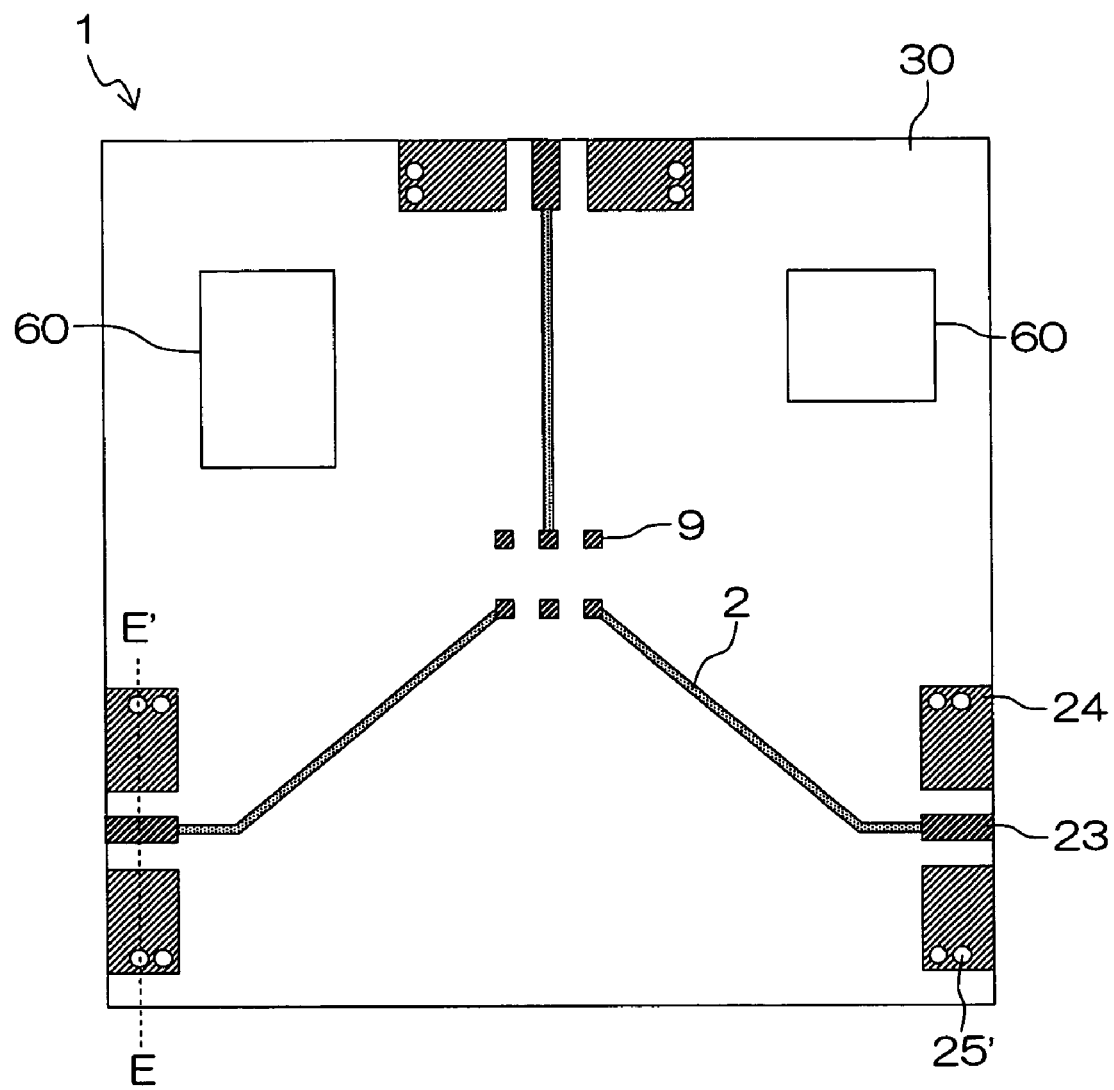
FIG. 13B is a plan view of a surface showing still another example of the high frequency device mounting substrate according to the present invention.

FIGS. 13A and 13B are plan views showing a surface of a high frequency device mounting substrate 1 in this example.

In this example shown in FIG. 13A, a through hole 25 is formed in an area, on the side of the outer periphery of a circuit board 30, in a ground electrode 24 on a surface of the high frequency device mounting substrate 1, and a through hole 25' is further arranged from the outer periphery of the circuit board 30 toward the center thereof in an area, on the opposite side of a signal line 2, in the ground electrode 24.

In this example shown in FIG. 13B, a through hole 25' is arranged from the outer periphery of the circuit board 30 toward the center thereof in the area, on the opposite side of the signal line 2, in the ground electrode 24 in place of the through hole 25.

Figure 14:
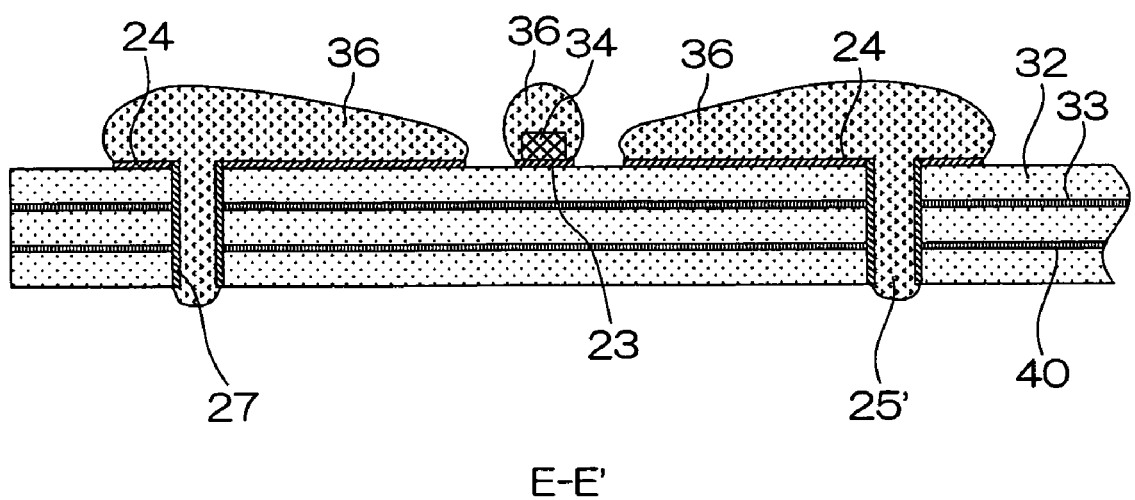
FIG. 14 is a cross-sectional view of a principal part, cut along a line E-E', of the high frequency device mounting substrate shown in FIG. 13A.

FIG. 14 is a cross-sectional view of a principal part, cut along a line E-E' shown in FIGS. 13A and 13B, in a case where a coaxial connector is connected to the high frequency device mounting substrate 1 with solder 36.

Figure 15:
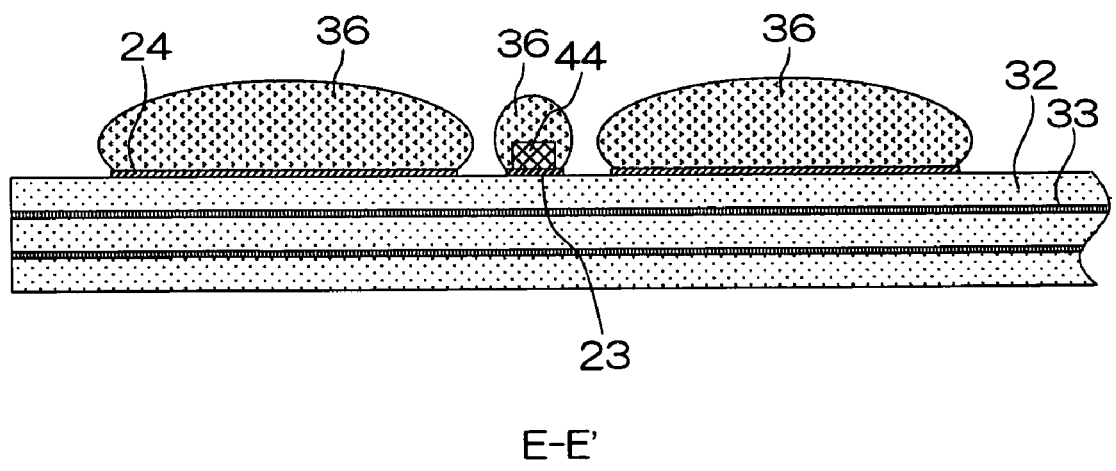
FIG. 15 is a cross-sectional view of a principal part of a high frequency device mounting substrate according to a comparative example.

Furthermore, FIG. 15 is the same cross-sectional view of a principal part as FIG. 14 in a case where the through hole 25' is not provided as a comparative example.

In a case where the ground electrode 24 is not provided with the through hole 25', respective distributions of solders 36 existing on an upper surface of the ground electrode 24 and an upper surface of a signal electrode 23 are close together due to the surface tension of the solder 36. Therefore, the solders may, in some cases, be short-circuited if the quantities thereof are large.

On the other hand, in this example, the solder 36 flows into the through hole 25' so that the solder 36 existing on an upper surface of the ground electrode 24 can be distributed so as to move slightly farther apart from the signal electrode 23, as shown in FIG. 14. Consequently, the signal electrode 23 and the ground electrode 24 can be made difficult to short-circuit through the solder 36.

Although description was herein made of a case where there is no second ground electrode 28 on the reverse surface of the high-frequency device mounting substrate 1, a second ground electrode 28 may be provided on the reverse surface thereof, as in the example shown in FIGS. 10 to 12.

A surface ground conductor layer 4 may be provided along the signal line 2 on the surface of the circuit board 30 so far described in FIGS. 8 to 15.

Figure 16:
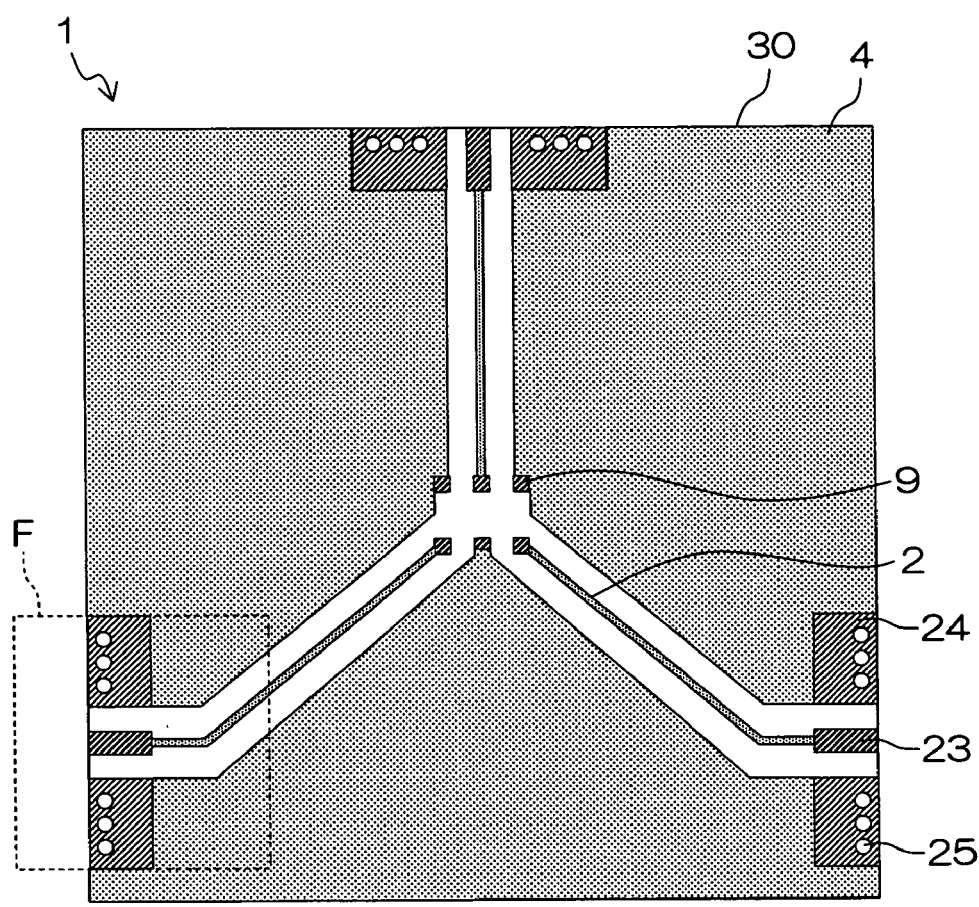
FIG. 16 is a plan view of a surface showing a further example of the high frequency device mounting substrate according to the present invention.

FIG. 16 is a plan view of a surface of a high frequency device mounting substrate 1 in an example in which a surface ground conductor layer 4 and a ground electrode 24 are connected to each other.

Such a configuration allows the surface ground conductor layer 4 to be connected to a ground electrode in a measuring equipment in a state where a parasitic inductance is the smallest. Therefore, a potential at one, to be grounded, of signal terminals of a high frequency device can be brought closer to the ground potential on the measuring equipment in a state where the parasitic inductance is smaller.

The high frequency device mounting substrate 1 according to the present invention is applicable to a communications apparatus.

That is, in a communications apparatus comprising one or both of a receiving circuit and a transmission circuit, the high frequency device mounting substrate 1 according to the present invention can be used.

The transmission circuit is a circuit that attenuates an unnecessary signal through a band-pass filter with a transmission signal on a carrier frequency by a mixer, then amplifies the transmission signal with a power amplifier, and transmits the amplified transmission signal from an antenna through a duplexer, for example.

The receiving circuit is a circuit that receives a receiving signal from an antenna, amplifies the receiving signal that has passed through the duplexer with a low-noise amplifier, then attenuates an unnecessary signal through a band-pass filter, separates a signal from a carrier frequency with a mixer, and extracts the signal.

The duplexer and the band-pass filter are mounted on the high frequency device mounting substrate 1 according to the present invention, and are incorporated into the communications apparatus, so that the communications apparatus having superior characteristics on which the high frequency device mounting substrate 1 according to the present invention is carried can be realized.

A method of evaluating the high frequency device using the high frequency device mounting substrate 1 will be then described.

The high frequency device mounting substrate 1 is employed for the purpose of making acceptable product judgment in the characteristics inspection process in the mass production line of high frequency devices and for the purpose of evaluating the characteristics of developed products.

Specifically, in a case where the high frequency device is a duplexer using a piezoelectric filter, a lot of piezoelectric filters are collectively formed on a wafer composed of a piezoelectric substance, each of the piezoelectric filters is then cut into pieces, each of the piezoelectric filter pieces is flip-chip mounted on a predetermined circuit board by face-down to obtain a duplexer, and the obtained duplexer is mounted on the high frequency device mounting substrate 1 to make acceptable product judgment. In the characteristics inspection process for making the acceptable product judgment, the duplexer cannot be mounted on the high frequency device mounting substrate 1 with solder. Therefore, the duplexer and the high frequency device mounting substrate 1 are connected to each other through a contact pin or the like arranged in a terminal electrode on the high frequency device mounting substrate 1. In this case, in order to stably measure characteristics, the high frequency device mounting substrate 1, together with a jig for fixing the contact pin and a guide for fixing the position where the duplexer is carried, is fixed on a base composed of brass, aluminum, or the like, and is pressed at a predetermined pressure from the top of the duplexer, to make connection with the contact pin constant.

In this state, the coaxial cable is connected to the signal electrode 23 and the ground electrode 24 in the high frequency device mounting substrate 1 by soldering, to evaluate the characteristics of the high frequency device, as described above.

EXAMPLE 1

FR-4 (glass epoxy resin) was used as a material for an insulator layer (a circuit board) in a high frequency device mounting substrate.

The high frequency device mounting substrate was made to have a laminated structure by forming one ground conductor layer on a surface of the circuit board and alternately repeating an insulator layer having a thickness of 0.1 mm and a conductor layer covering a reverse surface of the insulator layer three times on a reverse surface of the circuit board The width and the thickness of a signal line arranged on the surface of the circuit board were respectively set to 0.13 mm and 0.06 mm, and a gap W between the signal line and ground conductor layers located on both sides thereof was 1 mm. The signal line was so arranged as to radially extend from the center of the circuit board, as shown in FIGS. 1 and 2.

It was configured that the conductor layer covering the reverse surface of each of the insulator layers covered the whole reverse surface of the insulator layer.

A ground potential on the ground conductor layer located on the surface of the circuit board was stabilized by providing via conductors respectively penetrating the first to third insulator layers at predetermined spacing of 0.7 mm at a position 0.5 mm apart from a side, on the side of the signal line, of the ground conductor layer along the side. The signal line was so designed that the characteristic impedance thereof would be 50 Ω.

Isolation characteristics were measured by carrying on the example of the high frequency device mounting substrate according to the present invention having such a configuration a ultracompact duplexer in the 800 MHz band having its surface, opposed to the mounting substrate, 2.5 mm by 2.0 mm in size, and connecting a coaxial cable serving as measuring wiring to the signal line.

Figure 17:
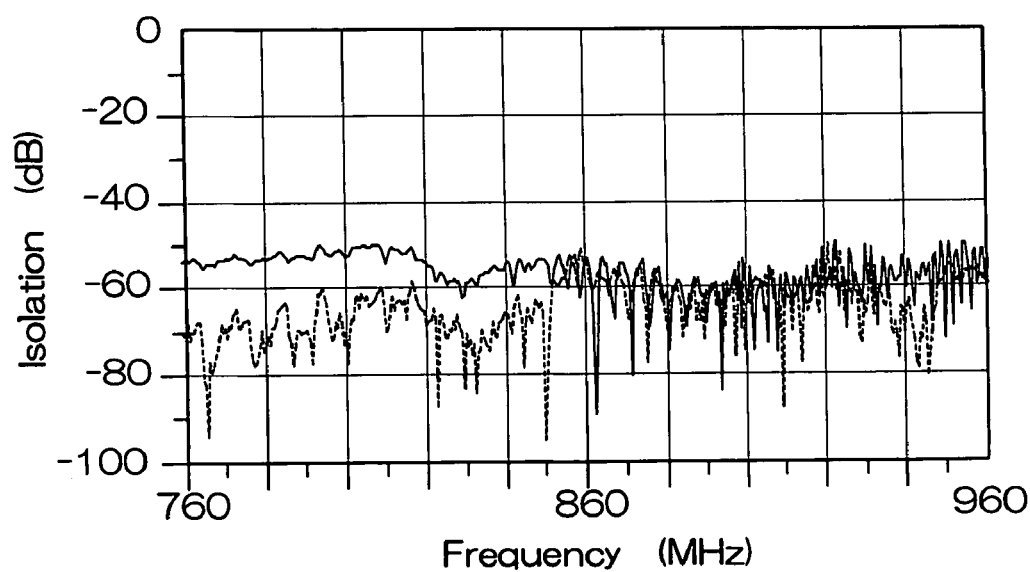
FIG. 17 is a graph for comparing respective isolation characteristics in an example and a comparative example of the present invention.

As a comparative example, the same measurement was also made of a high frequency device mounting substrate in which a non-formed region in a conductor layer on a reverse surface of the first insulator layer just below the position where a duplexer is carried was patterned in a region in the vicinity of an area just below a terminal electrode. FIG. 17 graphically shows the results of the measurement of the isolation characteristics.

In FIG. 17, the horizontal axis represents frequency (unit: MHz), and the vertical axis represents isolation (unit: dB).

A characteristic curve indicated by a solid line represents results in the comparative example, and a characteristic curve indicated by a broken line represents results in the example of the present invention.

As apparent from the graph shown in FIG. 17, the region in the vicinity of the area just below the position where the duplexer is carried was covered with the conductor layer formed on the reverse surface of the insulator layer, as in the example of the present invention, so that isolation characteristics in a transmission band (824 to 849 MHz) could be greatly improved to approximately 10 dB.

EXAMPLE 2

A high frequency device mounting substrate 1 having a configuration shown in FIG. 16 was manufactured.

A signal line 2 radially extended from a terminal electrode 9, and a structure of a region F to which a coaxial connector is to be connected was as shown in FIG. 16.

Figure 18:
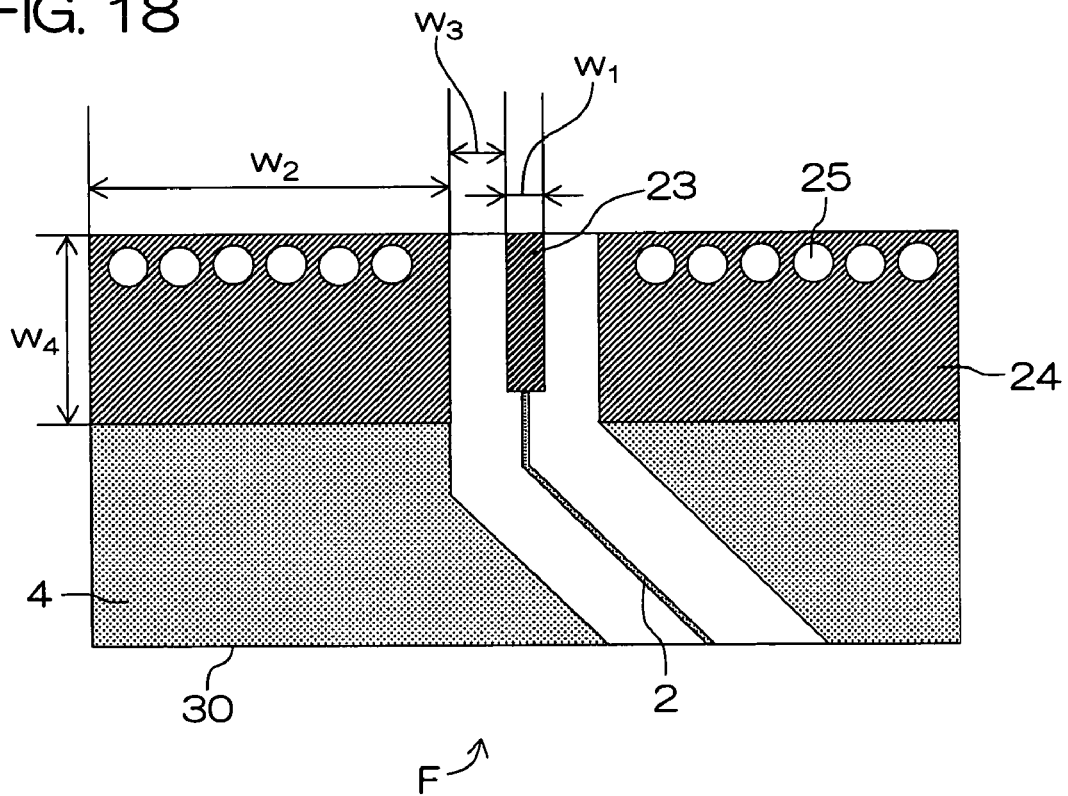
FIG. 18 is an enlarged view of a region F shown in FIG. 16.

FIG. 18 is an enlarged view of the region F indicated by a broken line in FIG. 16. The number of through holes 25 and the positions thereof were as shown in FIG. 18.

There were three portions to which the coaxial connector is to be connected, including the region F, as shown in FIG. 16, and all the portions were made to have a shape shown in FIG. 18.

Figure 19:
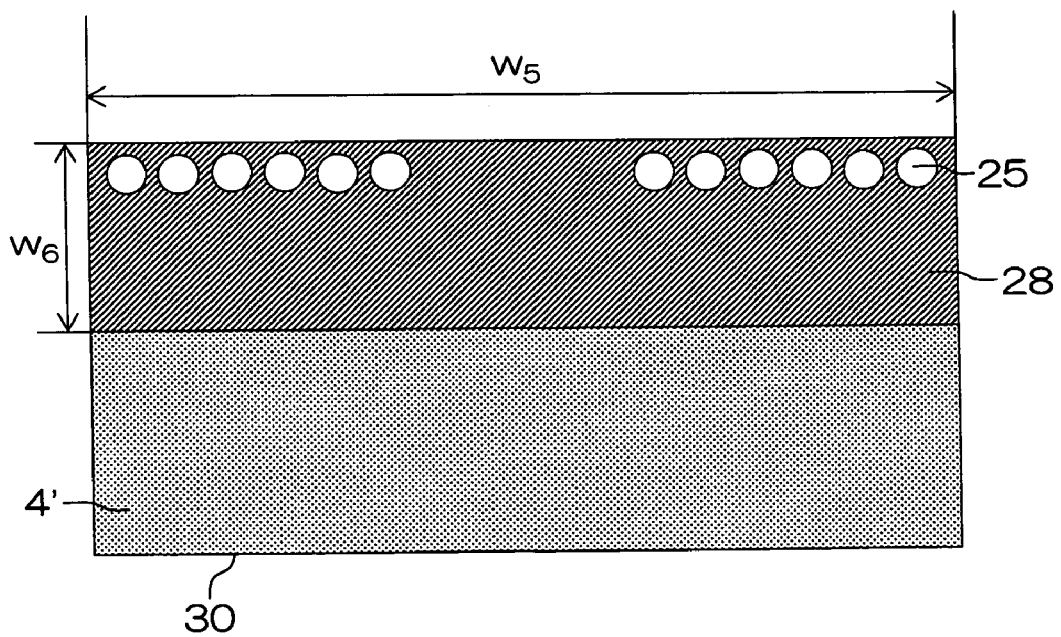
FIG. 19 is an enlarged view of a reverse surface of the region F.

FIG. 19 is an enlarged view of a reverse surface of an area corresponding to that shown in FIG. 18. Second ground electrodes respectively opposed to two ground electrodes 24 on a surface of a circuit board 30 were formed as one series. In FIG. 19, reference numeral 4' denotes a ground conductor layer formed on a reverse surface of the circuit board 30.

A cross-sectional view of a principal part of the circuit board 30 is the same as that shown in FIG. 11.

FR-4 (glass epoxy resin) was used as a material for insulator layers 32, 39, and 41 in the circuit board 30, and copper was used as a material for ground conductor layers 33 and 40, the ground electrode 24, the second ground electrode 28, and the reverse surface ground conductor layer 4'.

The respective thicknesses of the insulator layer 32 and the insulator layer 41 were 0.1 mm, and the thickness of the insulator layer 39 was 1 mm. The respective thicknesses of the ground conductor layer 33 and the ground conductor layer 40 were 0.035 mm. The respective thicknesses of the ground electrode 24 and the second ground electrode 28 were 0.06 mm. The width of the signal line 2 on the surface of the circuit board 30 was set to 0.13 mm, the width $w_1$ of a signal electrode 23 to which a center conductor 44 in a coaxial connector is connected was set to 0.6 mm, the horizontal width $w_2$ of the ground electrode 24 was set to 5 mm, and a gap $w_3$ between the signal electrode 23 and the ground electrode 24 was set to 0.85 mm.

The signal line 2 was so designed that the characteristic impedance thereof would be 50 Ω. The vertical width $w_4$ of the ground electrode 24 was set to 3 mm. Further, the horizontal width $w_5$ of the second ground electrode 28 on the reverse surface of the circuit board 30 was set to 13 mm, and the vertical width $w_6$ thereof was set to 3 mm. The ground electrode 24 was provided with six through holes 25 each having a radius of 0.3 mm, which penetrate the circuit board 30 and the second ground electrode 28 on the reverse surface of the circuit board 30, at spacing of 0.8 mm from a position 0.6 mm apart from the inside of the ground electrode 24 and 0.3 mm apart from the outer periphery of the ground electrode 24 (the outer periphery of the circuit board 30). Each of the through holes 25 had a conductor layer 27 composed of copper formed on its inner surface, to stabilize ground potentials on a surface ground conductor layer 4 connected to the ground electrode 24 and the reverse surface ground conductor layer 4' connected to the second ground electrode 28.

As a comparative example, a high frequency device mounting substrate whose design is the same as that in the above-mentioned example except that the through hole 25 is not provided was manufactured.

With respect to each of the high frequency device mounting substrates in the example and the comparative example of the present invention thus manufactured, a high frequency device was carried thereon, a coaxial connector was mounted thereon, high frequency characteristics were then measured through a signal line 2, the coaxial connector was then removed, and the high frequency characteristics were measured again.

The measurement at this time was made by bringing a high frequency probe (Pico-probe 40A-GS-600-DP (trade name) manufactured by GGB Industries, Inc.) into direct contact with a terminal electrode in the high frequency device.

As the high frequency device, a duplexer in the 800 MHz band using a small-sized frequency filter having its surface, connected to the terminal electrode 9, 2.5 mm by 2.0 mm in size and 0.6 mm in height was used.

First, with respect to both the example and the comparative example, a cream solder was applied to the terminal electrode 9, and the high frequency device was carried on the high frequency device mounting substrate. The cream solder was melted using a hot plate, to connect a terminal of the high frequency device and the terminal electrode 9.

The coaxial connector was then mounted. With respect to both the example and the comparative example, wire solders (Sn-Cu-Ag: melting point 217° C.) were respectively melted to the signal electrode 23, the ground electrode 24, and the second ground electrode 28 using soldering iron, to mount the coaxial connector on the high frequency device mounting substrate 1.

When the comparative example was used, the respective quantities of the wire solders to be melted were not constant even if heat was applied to the wire solders only for the same time period, and the solders on the ground electrode 24 and the second ground electrode 28 could not directly flow into each other, so that it was very difficult to make the quantities of the solders on the ground electrode 24 and the second ground electrode 28 uniform.

On the other hand, in the example, when the respective solders 36 on the signal electrode 23 and the ground electrode 24 were melted using the soldering iron, heat was also conducted to the solder 36 on the second ground electrode 28 through the through hole 25, so that the solder 36 on the second ground electrode 28 could be also simultaneously melted. Further, the melted solders 36 flowed into each other through the through hole 25, thereby eliminating bias of the quantities of the solders on the ground electrode 24 and the second ground electrode 28.

The coaxial connector connected to the high frequency device mounting substrate 1 and the measuring equipment were connected to each other by a cable, to measure the high frequency characteristics of the high frequency device.

Although the coaxial connector might, in some case, separate from the high frequency device mounting substrate 1 due to a force applied by the cable for connecting the coaxial connector and the measuring equipment in the comparative example, the solder 36 could continuously exist from the second ground electrode 28 on the reverse surface of the high frequency device mounting substrate 1 to the outer peripheral conductor in the coaxial connector on the side of the ground electrode 24 on the surface thereof through the through hole 25, as shown in FIG. 12. Therefore, the high frequency device mounting substrate 1 and the coaxial connector could be connected to each other more firmly, so that the coaxial connector did not separate from the high frequency device mounting substrate 1.

The coaxial connector was then removed from the high frequency device mounting substrate 1.

In the comparative example, in order to remove the coaxial connector, the solder on the second ground electrode 28 was first removed using a solder sucker (Solder Removal Station 24V474 (trade name) manufactured by Hakko corporation), to enter a state where joining between the coaxial connector and the high frequency device mounting substrate 1 was held only by the respective solders on the signal electrode 23 and the ground electrode 24, and the solders on the signal electrode 23 and the ground electrode 24 were melted, to remove the coaxial connector from the high frequency device mounting substrate 1.

On the other hand, in the example, when the respective solders 36 on the signal electrode, 23 and the ground electrode 24 were melted using the soldering iron, heat was also conducted to the solder 36 on the second ground electrode 28 through the through hole 25, so that the solder 36 on the second ground electrode 28 could be also simultaneously melted. Therefore, the coaxial connector could be removed in a short time period more easily, as compared with that in the comparative example.

In the example, the coaxial connector could be removed by eliminating the necessity of using the solder sucker and only by applying heat to the solder 36 on one surface using the soldering iron to also melt the solder 36 on the other surface. Therefore, a time period during which heat was applied to the high frequency device mounting substrate 1 and the high frequency device could be made considerably shorter, as compared with that in the comparative example.

The high frequency device was then removed. The high frequency device mounting substrates 1 in the example and the comparative example were respectively put on the hot plates and were heated to melt the cream solders, and the high frequency device were removed using tweezers.

Thereafter, the high frequency characteristics of the removed high frequency device were measured. As a result, in a case where the high frequency device mounting substrate 1 in the example of the present invention was used, there was no high frequency device whose characteristics were degraded before and after a series of operations, described above. On the other hand, in a case where the high frequency device mounting substrate in the comparative example was used, a high frequency device whose high frequency characteristics were degraded due to heat applied at the time of mounting and removing the coaxial connector was produced.

EXAMPLE 3

Figure 20:
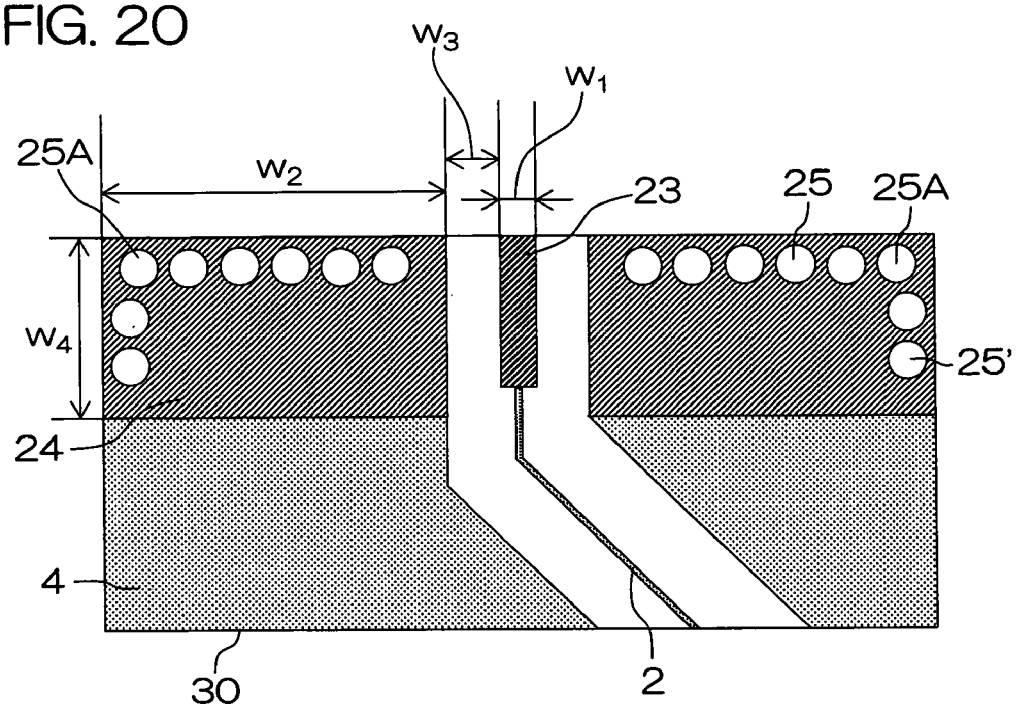
FIG. 20 is an enlarged view showing another structure in the region F.

Although a plan view on a surface of a high frequency device mounting substrate 1 in an example 3 is the same as that in the example 1, it differs in that two through holes 25' of the same size as the through hole 25 were located from a through hole 25A positioned at an end, on the opposite side of a signal electrode 23, of a ground electrode 24 toward the outer periphery to the center of a circuit board 30, as shown in an enlarged view of FIG. 20.

In the example 2, the distributions of the solders 36 existing on the upper surface of the ground electrode 24 and the upper surface of the signal electrode 23 were close together due to the surface tension of the solders 36, as shown in FIG. 15. Therefore, the ground electrode 24 and the signal electrode 23 might, in some cases, be short-circuited through the solders 36 depending on the quantities thereof.

The ground electrode 24 was provided with the through holes 25', as in this example, so that solder 36 flowed into the through holes 25', as shown in FIG. 14. Therefore, the solder 36 existing on the top of the ground electrode 24 could be distributed so as to slightly move apart from the signal electrode 23, so that the signal electrode 23 and the ground electrode 24 were not short-circuited through the solder 36.

The present invention is not limited to the foregoing embodiments and examples. Various changes may be safely made without departing from the scope of the present invention.

For example, a material for an insulator layer in a circuit board is not limited to materials listed in the following example. For example, organic materials such as tetrafluoroethylene or BT resin, or inorganic materials such as ceramics such as alumina, or glass ceramics mainly composed of alumina may be The number of laminated conductor layers covering an insulator layer and a reverse surface of the insulator layer may be an arbitrary number. Although description was made of an example in which the ground conductor layer 28 was further provided on the reverse surface in addition to the ground conductor layer 33, the ground conductor layer 28 may be omitted.

Although the shape of the through hole 25 was a circle in FIG. 8, for example, the shape may be arbitrary. Although the through hole 25 was provided from the outer periphery of the circuit board 3 to a position somewhat beyond the center of the circuit board 30, the through hole 25 may be formed so as to open in the length direction in the outer periphery of the circuit board 30 and an inner surface of the through hole 25 may be coated with the conductor layer 27 as a so-called castellation conductor to connect the ground electrode 24 to the ground conductor layers 33 and 40 and the second ground electrode 28 through an outer peripheral surface of the circuit board 30.

The characteristic impedance of the signal line is not limited to 50 Ω. For example, it may be matched with the characteristic impedance of a system using a high frequency device.

Figure 21:
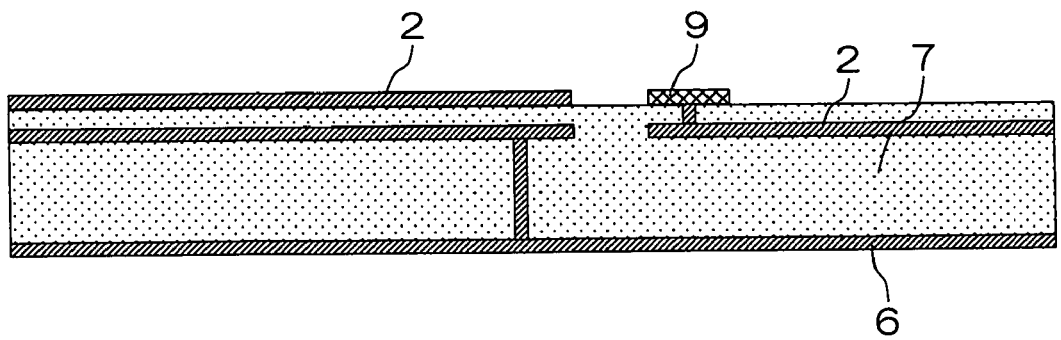
FIG. 21 is a cross-sectional view showing a high frequency device mounting substrate according to the present invention, in which signal lines are formed in a circuit board.

Although description was made of a case where the signal line is arranged on the surface of the high frequency device mounting substrate, some of signal lines may be arranged in an inner part of an insulator layer, as shown in FIG. 21. In this case, the signal lines are respectively provided on different layers so that the signal lines are not also opposed to one another in the thickness direction. Therefore, isolation characteristics between the signal lines can be further improved. This allows the effect on the characteristics of the high frequency device to be further reduced or allows the characteristics to be more satisfactorily exhibited.

Although in the figures used for description, there are three sets of terminals (sets of signal electrodes 23 and ground electrodes 24) at which the high frequency device mounting substrate 1 and the coaxial connector are connected to each other, the number of sets of terminals may be arbitrary in conformity with the number of terminals in the high frequency device.

A portion, which need not be brought into contact with solder, on the surface of the high frequency device mounting substrate 1 may be protected by solder resist or the like. This allows solder to exist in only a portion with which the solder is to be brought into contact, and can prevent conductors in the signal lines 2 or the like from being short-circuited through an extra solder.

Furthermore, the high frequency device is not limited to a piezoelectric filter or a duplexer. For example, the present invention is also applicable to all high frequency devices used for high frequency signal processing applications such as a mobile communications apparatus, wireless LAN (Local Area Network), and ETC, (Electronic Toll Collection).

The scope of the present invention also covers a configuration in which configurations described in the claims are arbitrarily combined.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A high frequency device mounting substrate comprising:
   a circuit board having a conductor layer on a reverse surface or an inner part of an insulator layer;
   a plurality of terminal electrodes located on a surface of the circuit board for connecting to terminals of a high frequency device;
   a plurality of signal lines located on the surface of the circuit board and respectively connecting with the terminal electrodes; and
   a ground conductor layer located on the surface of the circuit board, wherein
   a gap between the signal line and the ground conductor layer is larger than a distance between the signal line and the conductor layer formed on the reverse surface or the inner part of the insulator layer, and
   the signal lines respectively radially extending from the terminal electrodes, wherein a straight line that is a virtual extension of the one arbitrary signal line from the terminal electrode and a straight line that is a virtual extension of the other one arbitrary signal line from the terminal electrode not constituting a same straight line.

2. The high frequency device mounting substrate according to claim 1, wherein the two extensions cross each other at one point.

3. The high frequency device mounting substrate according to claim 1, wherein the two extensions are parallel to each other.

4. The high frequency device mounting substrate according to claim 1, wherein the terminal electrode is arranged at a center portion of the circuit board.

5. A communications apparatus on which the high frequency device mounting substrate according to claim 1 is carried.

6. The high frequency device mounting substrate according to claim 1, wherein a plurality of through conductors that penetrate the circuit board and are electrically connected to the conductor layer formed on the reverse surface or the inner part of the insulator layer are connected to the ground conductor layer.

7. The high frequency device mounting substrate according to claim 1, wherein the high frequency device is a piezoelectric filter.

8. The high frequency device mounting substrate according to claim 1, wherein the high frequency device is a branching filter.

9. A method of evaluating the characteristics of a high frequency device mounted on a high frequency device mounting substrate, comprising steps of:
   (a) mounting the high frequency device on the high frequency device mounting substrate, the high frequency device mounting substrate comprising:
   a circuit board having a conductor layer on a reverse surface or an inner part of an insulator layer:
   a plurality of terminal electrodes located on a surface of the circuit board for connecting to terminals of a high frequency device; and
   a plurality of signal lines located on the surface of the circuit board and respectively connecting with the terminal electrodes; wherein
   the signal lines respectively radially extending from the terminal electrodes, wherein a straight line that is a virtual extension of the one arbitrary signal line from the terminal electrode and a straight line that is a virtual extension of the other one arbitrary signal line from the terminal electrode not constituting a same straight line;
   (b) connecting measuring wiring to the high frequency device mounting substrate; and
   (c) inspecting the characteristics of the high frequency device mounted on the high frequency device mounting substrate.

10. A high frequency device mounting substrate comprising:
    a circuit board having a conductor layer on a reverse surface or an inner part of a insulator layer;
    a plurality of terminal electrodes located on a surface of the circuit board for connecting to terminals of a high frequency device;
    a plurality of signal lines located on the surface of the circuit board and respectively connecting with the terminal electrodes;
    a signal electrode arranged in a peripheral part on the surface of the circuit board and connecting with the signal line, to which a center conductor in a coaxial connector is connected; and
    a ground electrode arranged in the peripheral part on the surface of the circuit board for connecting an outer peripheral conductor in the coaxial connector using solder, wherein
    the ground electrode having a through hole that penetrates the circuit board formed in its region to which the solder adheres,
    an inner surface of the through hole being coated with the conductor layer, and
    the signal lines respectively radially extending from the terminal electrodes, wherein a straight line that is a virtual extension of the one arbitrary signal line from the terminal electrode and a straight line that is a virtual extension of the other one arbitrary signal line from the terminal electrode not constituting a same straight line.

11. The high frequency device mounting substrate according to claim 10, wherein the circuit board is a laminated substrate having a plurality of insulator layers laminated therein and has an internal conductor layer formed in its inner part, and the conductor layer formed on the inner surface of the through hole is connected to the internal conductor layer.

12. The high frequency device mounting substrate according to claim 10, wherein a second ground electrode is formed in an area corresponding to the ground electrode on the reverse surface of the circuit board, and the second ground electrode is connected to the ground electrode on the surface of the circuit board through the conductor layer formed on the inner surface of the through hole.

13. The high frequency device mounting substrate according to claim 10, wherein a plurality of through holes are arranged in an area, along the outer periphery of the circuit board, in the ground electrode.

14. The high frequency device mounting substrate according to claim 13, wherein the through hole is further arranged from the outer periphery of the circuit board toward the center thereof in an area, on the opposite side of the signal line, in the ground electrode.

15. The high frequency device mounting substrate according to claim 10, wherein the through hole is arranged from the outer periphery of the circuit board toward the center thereof in an area, on the opposite side of the signal line, in the ground electrode.

16. The high frequency device mounting substrate according to claim 10, wherein a surface ground conductor layer formed along the signal line on the surface of the circuit board is connected to the ground electrode.

17. A high frequency device mounting substrate comprising:

a circuit board having a conductor layer on a reverse surface or an inner part of an insulator layer;

a terminal electrode located on a surface of the circuit board for connecting to terminals of a high frequency device;

a ground conductor layer located on the surface of the circuit board;

a signal line located on the surface of the circuit board and connecting with the terminal electrode;

a signal electrode arranged in a peripheral part on the surface of the circuit board and connecting with the signal line, to which a center conductor in a coaxial connector is connected; and a ground electrode arranged in the peripheral part on the surface of the circuit board for connecting an outer peripheral conductor in the coaxial connector using solder, wherein a gap between the signal line and the around conductor layer is larger than a distance between the signal line and the conductor layer formed on the reverse surface or the inner part of the insulator layer, the ground electrode has a through hole that penetrates the circuit board formed in its region to which the solder adheres, and an inner surface of the through hole being coated with the conductor layer.

18. The high frequency device mounting substrate according to claim 17, wherein the high frequency device is a piezoelectric filter.

19. The high frequency device mounting substrate according to claim 17, wherein the high frequency device is a branching filter.

20. A communications apparatus on which the high frequency device mounting substrate according to claim 17 is carried.

21. The high frequency device mounting substrate according to claim 17, wherein the through hole is further arranged from the outer periphery of the circuit board toward the center thereof.

22. The high frequency device mounting substrate according to claim 17, wherein the circuit board is a laminated substrate having a plurality of insulator layers laminated therein and has an internal conductor layer formed in its inner part, and the conductor layer formed on the inner surface of the through hole is connected to the internal conductor layer.

23. The high frequency device mounting substrate according to claim 17, wherein a second ground electrode is formed in an area corresponding to the ground electrode on the reverse surface of the circuit board, and the second ground electrode is connected to the ground electrode on the surface of the circuit board through the conductor layer formed on the inner surface of the through hole.

24. A method of evaluating the characteristics of a high frequency device mounted on a high frequency device mounting substrate, comprising steps of:

(a) mounting the high frequency device on the high frequency device mounting substrate, the high frequency device mounting substrate comprising:

a circuit board having a conductor layer on a reverse surface or an inner part of an insulator layer;

a terminal electrode located on a surface of the circuit board for connecting to terminals of a high frequency device;

a signal line located on the surface of the circuit board and connecting with the terminal electrode;

a signal electrode arranged in a peripheral part on the surface of the circuit board and connecting with the signal line, to which a center conductor in a coaxial connector is connected; and a ground electrode arranged in the peripheral part on the surface of the circuit board for connecting an outer peripheral conductor in the coaxial connector using solder, the ground electrode having a through hole that penetrates the circuit board formed in its region to which the solder adheres, and an inner surface of the through hole being coated with the conductor layer;

(b) connecting a coaxial connector to the high frequency device mounting substrate using solder; and (c) inspecting the characteristics of the high frequency device mounted on the high frequency device mounting substrate.

* * * * *